United States Patent
Autry et al.

(10) Patent No.: US 11,869,679 B2
(45) Date of Patent: Jan. 9, 2024

(54) RAMSEY-BORDÉ ION FREQUENCY-REFERENCE APPARATUS, AND METHODS OF MAKING AND USING THE SAME

(71) Applicant: HRL Laboratories, LLC, Malibu, CA (US)

(72) Inventors: Travis Autry, Calabasas, CA (US); Ian Counts, Santa Monica, CA (US); Jennifer Ellis, Calabasas, CA (US); Danny Kim, Agoura Hills, CA (US); Christopher Roper, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 169 days.

(21) Appl. No.: 17/576,897

(22) Filed: Jan. 14, 2022

(65) Prior Publication Data
US 2023/0076629 A1  Mar. 9, 2023

Related U.S. Application Data

(60) Provisional application No. 63/159,167, filed on Mar. 10, 2021.

(51) Int. Cl.
*G21K 1/02* (2006.01)
*G21K 1/00* (2006.01)
(Continued)

(52) U.S. Cl.
CPC ............. *G21K 1/02* (2013.01); *G21K 1/006* (2013.01); *H03L 7/26* (2013.01); *G04F 5/14* (2013.01)

(58) Field of Classification Search
CPC .. G21K 1/02; G21K 1/006; H03L 7/26; G04F 5/14
(Continued)

(56) References Cited

U.S. PATENT DOCUMENTS

| 3,578,834 A | 5/1971 | Porta et al. |
| 4,495,478 A | 1/1985 | Kwon et al. |

(Continued)

FOREIGN PATENT DOCUMENTS

| JP | 2020091239 A | 12/2018 |
| WO | 1997012298 A1 | 4/1997 |

(Continued)

OTHER PUBLICATIONS

McFarran, et al ("Fractional frequency instability in the 10^-14 range with a thermal beam optical frequency reference," J. Opt. Soc. Am. B, vol. 27, No. 2, Feb. 2010, pp. 277-285 (Year: 2010).*

(Continued)

*Primary Examiner* — Michael Maskell
(74) *Attorney, Agent, or Firm* — O'Connor & Company; Ryan P. O'Connor

(57) ABSTRACT

In some variations, an interferometric frequency-reference apparatus comprises: an atom source configured to supply neutral atoms to be ionized; an ionizer configured to excite the neutral atoms to form ionized atoms; an ion collimator configured to form a collimated beam of the ionized atoms; probe lasers; and a Doppler laser configured to determine a ground-state population of the ionized atoms, wherein the atom source, the ionizer, and the ion collimator are disposed within a vacuum chamber. Other variations provide a method of creating a stable frequency reference, comprising: forming ionized atoms from an atomic vapor; forming a collimated beam of ionized atoms; illuminating ionized atoms with first and second probe lasers; adjusting the
(Continued)

frequencies of the first probe and second probe lasers using Ramsey spectroscopy to an S→D transition of ionized atoms; and determining a ground-state population of the ionized atoms with another laser.

38 Claims, 5 Drawing Sheets

(51) Int. Cl.
  *H03L 7/26* (2006.01)
  *G04F 5/14* (2006.01)

(58) Field of Classification Search
  USPC .............................................. 250/251, 423 R
  See application file for complete search history.

(56) References Cited

U.S. PATENT DOCUMENTS

| | | | |
|---|---|---|---|
| 5,192,921 | A | 3/1993 | Chantry et al. |
| 7,126,112 | B2 | 10/2006 | Anderson et al. |
| 8,009,520 | B2 | 8/2011 | Jau et al. |
| 8,258,884 | B2 | 9/2012 | Borwick, III et al. |
| 8,624,682 | B2 | 1/2014 | Ridley et al. |
| 8,999,123 | B2 | 4/2015 | Bernstein et al. |
| 9,064,942 | B2 | 6/2015 | Bangsaruntip et al. |
| 9,077,354 | B2 | 7/2015 | Strabley et al. |
| 9,685,483 | B2 | 6/2017 | Nazarian et al. |
| 9,763,314 | B1 | 9/2017 | Roper et al. |
| 9,837,177 | B1 | 12/2017 | Roper et al. |
| 10,056,913 | B1 | 8/2018 | Roper et al. |
| 10,545,461 | B1 | 1/2020 | Roper et al. |
| 10,666,275 | B1* | 5/2020 | Tiemann ............. H03L 7/26 |
| 10,775,748 | B1 | 9/2020 | Roper et al. |
| 10,828,618 | B1* | 11/2020 | Roper ............. B01J 19/088 |
| 2011/0247942 | A1 | 10/2011 | Bernstein et al. |
| 2014/0227548 | A1 | 8/2014 | Myrick |
| 2015/0226669 | A1 | 8/2015 | Compton |
| 2017/0370840 | A1* | 12/2017 | Sinclair ............. G01N 21/645 |
| 2018/0321641 | A1* | 11/2018 | Boyd ............. H01S 3/1305 |
| 2021/0389114 | A1* | 12/2021 | Kozuma ............. G01B 9/02016 |

FOREIGN PATENT DOCUMENTS

| | | |
|---|---|---|
| WO | 2000049732 A1 | 8/2000 |
| WO | 2000043842 A2 | 2/2001 |

OTHER PUBLICATIONS

Svenja Knappe, MEMS Atomic Clocks, National Institute of Standards and Technology (NIST), Boulder, CO, USA Published by Elsevier B.V., Comprehensive Microsystems, vol. 3, pp. 571-612, Oct. 17, 2007.

Jonathan J. Bernstein et al., "All Solid-State Ion-Conducting Cesium Source for Atomic Clocks," Solid State Ionics, vol. 198, No. 1, Sep. 19, 2011.

Bernstein et al., "Solid State Electrochemical Alkali Sources for Cold Atom Sensing", Solid-State Sensors, Actuators and Microsystems Workshop, Hilton Head Island, South Carolina, Jun. 5, 2016.

Wan et al., "Study on the First-Principles Calculations of Graphite Intercalated by Alkali Metal (Li, Na, K)", Int. J. Electrochem. Sci., 10 (Feb. 24, 2015) 3177-3184.

McFerran et al., "Fractional frequency instability in the $10^{-14}$ range with a thermal beam optical frequency reference", J. Opt. Soc. Am. B, vol. 27, No. 2, Jan. 22, 2010.

Allan, "Statistics of Atomic Frequency Standards", Proceedings of the IEEE, vol. 54, No. 2, Feb. 1, 1966.

PCT/US2022/012632 International Search Report and Written Opinion, dated Apr. 29, 2022.

* cited by examiner

RAMSEY-BORDÉ ION FREQUENCY-REFERENCE APPARATUS, AND METHODS OF MAKING AND USING THE SAME

PRIORITY DATA

This patent application is a non-provisional application with priority to U.S. Provisional Patent App. No. 63/159,167, filed on Mar. 10, 2021, which is hereby incorporated by reference herein.

FIELD OF THE INVENTION

The present invention generally relates to optical frequency references.

BACKGROUND OF THE INVENTION

Frequency standards are devices for producing or probing frequencies. Optical frequency standards refer to stable optical frequencies, and are generated by optical atomic clocks and optical cavities. Frequency standards are useful in optical fiber communications, timing, radio frequency (RF) photonics, and inertial sensing as well as other technologies. Application areas of ultraprecise optical frequency standards include high-precision laser spectroscopy, miniature atomic instruments (e.g. atomic clocks and gyroscopes), global positioning systems, precision laser sensing (e.g., remote nuclear blast detection), and ultra-stable oscillators for high-speed analog-digital converters and radar systems.

An active optical frequency standard is a laser source emitting light with a very well-defined and known optical frequency (e.g., stabilized HeNe laser). A passive optical frequency standard is a passive device with a well-defined frequency response, which can be used to build an active standard. Important examples are high-quality-factor reference cavities and devices such as multi-pass gas cells for probing certain optical transitions.

An optical frequency standard is usually based on some optically probed electronic transition (generally a dipole-forbidden but quadrupole-allowed transition) with a narrow frequency bandwidth of atoms (e.g. Ca, Rb, Sr, Yb, Mg, or H), ions (e.g., $Hg^+$, $Sr^+$, $Yb^+$, $Ba^+$, $In^+$, or $Al^+$), or molecules (e.g., $CH_4$ or $I_2$). This electronic transition is used to stabilize the frequency of a single-frequency laser to the electronic transition frequency of the atom, ion, or molecule. In order to reduce inhomogeneous broadening by thermal movement and collisions, the particles may be retained in a trap within a vacuum chamber along with laser cooling. This conventional set-up allows for precise spectroscopic measurements on the clock transition.

Papers describing frequency references include McFerran et al., "Fractional frequency instability in the $10^{-14}$ range with a thermal beam optical frequency reference", J. Opt. Soc. Am. B, 27, 277-285 (2010); Norcia et al., "Frequency Measurements of Superradiance from the Strontium Clock Transition", Phys. Rev. X 8, 021036 (2018); Davila-Rodriguez et al., "Compact, thermal-noise-limited reference cavity for ultra-low-noise microwave generation", Opt. Lett. 42, 1277-1280 (2017); Matei et al., "1.5 μm Lasers with Sub-10 mHz Linewidth", Phys. Rev. Lett. 118, 263202 (2017); Kessler et al., "A sub-40-mHz-linewidth laser based on a silicon single-crystal optical cavity", Nature Photonics 6, 687-692 (2012); Cook et al., "Laser-Frequency Stabilization Based on Steady-State Spectral-Hole Burning in $Eu^{3+}$:$Y_2SiO_5$", Phys. Rev. Lett. 114, 253902 (2015); and Olson et al., "Ramsey-Bordé Matter-Wave Interferometry for Laser Frequency Stabilization at $10^{-16}$ Frequency Instability and Below", Phys. Rev. Lett. 123, 073202 (2019), each of which is hereby incorporated by reference.

Highly accurate optical frequency references play an important role in many applications. Optical frequency references with better performance than commercially available standards are desired, to enable high-precision spectroscopy at multiple locations, for example. In general, known frequency references are either extremely precise at the cost of massive size, weight, and power, or they sacrifice performance for reduced size, weight, and power. Large optical cavity-based frequency references are currently the standard method of generating an optical frequency reference at short integration/averaging times. At longer averaging times, optical atomic clocks are used.

There remains a long-felt need for a compact, ultra-stable, atom-based frequency reference that operates on short (e.g. <1 second) timescales and demonstrates a high degree of stability on long time scales.

SUMMARY OF THE INVENTION

The present invention addresses the aforementioned needs in the art, as will now be summarized and then further described in detail below.

In some variations, an interferometric frequency-reference apparatus comprises:
  a vacuum chamber;
  an atom source configured to supply neutral atoms to be ionized;
  an ionizer configured to excite the neutral atoms to form ionized atoms (such as, but not limited to, $Ca^+$ or $Sr^+$);
  an ion collimator configured to form a collimated beam of the ionized atoms;
  one or more probe lasers at a frequency near the clock transition (e.g., quadrupole transition); and
  a readout laser configured to determine a ground-state population of the ionized atoms typically realized by measuring a cycling transition of the atom such as the S—P transition in Sr+,
  wherein the atom source, the ionizer, and the ion collimator are disposed within the vacuum chamber.

In some embodiments, the atom source is a solid-state electrochemical atom source.

In some embodiments, the ionizer is disposed inside the ion collimator. In these embodiments, the ionized atoms are formed within the ion collimator. In other embodiments, the ionizer is disposed outside the ion collimator. In these embodiments, the ionized atoms are formed and then injected into the ion collimator. The ionizer may be one or more ionizing lasers, electron-beam radiation, or similar.

In some embodiments, the ion collimator is a linear collimator. A linear collimator may be selected from the group consisting of a linear quadrupole trap, a Penning trap, a surface ion trap, and a mass filter, for example. In other embodiments, the ion collimator is a non-linear collimator. A non-linear collimator may be in a recirculating configuration, such as a racetrack configuration, a ring, or a tortuous loop, for example.

The ion collimator may be configured such that the collimated beam of the ionized atoms has a beam waist selected from about 10 nanometers to about 10 meters. Preferably, the beam waist is selected from about 50 nanometers to about 500 nanometers. The ion collimator may be configured such that the collimated beam of the ionized atoms has a beam velocity selected from about 1 μm/s to about 0.99c, where c is the speed of light in vacuum. Preferably, the beam velocity is selected from about 1 m/s to about 20 m/s.

In some embodiments, one or more probe lasers are configured for Ramsey or Rabi spectroscopy on the ionized atoms. In preferred embodiments, all probe lasers present are configured for Ramsey spectroscopy on the ionized atoms. The number of probe lasers may vary but is preferably two or more, such as four probe lasers (e.g., see FIG. 4).

In some embodiments, the one or more probe lasers are configured to probe quadrupole or both dipole and quadrupole transitions of the ionized atoms. Configuring includes selecting proper wavelength and ensuring sufficiently narrow linewidth.

In some embodiments, the readout laser can be used for quantum jump measurements. For quantum jump measurements, the readout laser may be used, post-Ramsey interrogation, via fluorescence from a S→P cycling transition.

In some embodiments, the interferometric frequency-reference apparatus further comprises a cooling laser. The cooling laser is configured to cool the ionized atoms in preparation for Ramsey spectroscopy. In certain embodiments, the readout laser is itself configured for cooling, and there is not necessarily a physically distinct cooling laser.

The interferometric frequency-reference apparatus may further comprise an injection electrode. The injection electrode is different from the ionizer. An injection electrode may create an electric potential field that directs ionized atoms into the ion collimator, in embodiments wherein atoms are ionized outside the ion collimator. In preferred embodiments, atoms are ionized within the ion collimator; therefore, an injection electrode is not necessary.

The interferometric frequency-reference apparatus may further comprise an ion sink configured to collect the ionized atoms exiting the ion collimator. The ion sink is preferably disposed within the vacuum chamber.

The interferometric frequency-reference apparatus preferably further comprises an imaging system configured to focus fluorescence from the ionized atoms.

The interferometric frequency-reference apparatus provides an optical frequency reference, in some embodiments. The interferometric frequency-reference apparatus provides a microwave frequency reference, in some embodiments.

Other variations of the invention provide a method of creating a stable frequency reference, the method comprising:
(a) creating an atomic vapor;
(b) ionizing at least some atoms in the atomic vapor, to form ionized atoms;
(c) collimating the ionized atoms in an ion collimator, to form a collimated beam of the ionized atoms;
(d) optionally, illuminating some of the ionized atoms with a cooling laser;
(e) illuminating at least some of the ionized atoms with a first probe laser at a first-probe-laser frequency;
(f) illuminating at least some of the ionized atoms with a second probe laser at a second-probe-laser frequency;
(g) adjusting the first-probe-laser frequency and the second-probe-laser frequency using Ramsey spectroscopy to an S→D transition of at least some of the ionized atoms; and
(h) illuminating at least some of the ionized atoms with a readout laser to determine a ground-state population of the ionized atoms.

In some methods, the atomic vapor and/or the ionized atoms are obtained from a solid-state electrochemical atom source. The ionized atoms may be $Ca^+$ and/or $Sr^+$, in some embodiments.

The ionized atoms provided in step (b) may be formed within the ion collimator provided in step (c). Alternatively, or additionally, the ionized atoms provided in step (b) are formed and then injected into the ion collimator. Steps (b) and (c) may be integrated such that at least some of the ionizing occurs inside ion collimator. In some preferred embodiments, steps (b) and (c) may be integrated such that all of the ionizing occurs inside ion collimator.

In some methods, step (d) is conducted to cool the ionized atoms in preparation for the Ramsey spectroscopy. The cooling may employ the same laser as the readout laser (in which case it also is a cooling laser), or the cooling may employ a physically distinct laser.

In some methods, the ion collimator is a linear collimator. For example, the ion collimator may be a linear collimator selected from the group consisting of a linear quadrupole trap, a Penning trap, a surface ion trap, and a mass filter. In other methods, the ion collimator is a non-linear collimator. For example, the ion collimator may be a non-linear collimator selected from the group consisting of a racetrack configuration, a ring, a tortuous loop, or another recirculating configuration.

The collimated beam of the ionized atoms may have a beam waist selected from about 10 nanometers to about 10 meters, such as from about 50 nanometers to about 500 nanometers. The collimated beam of the ionized atoms may have a beam velocity selected from about 1 μm/s to about 0.99c, such as from about 1 m/s to about 20 m/s, where c is the speed of light in vacuum.

In some embodiments, the method further comprises illuminating at least some of the ionized atoms with a third probe laser. In certain embodiments, the method further comprises illuminating at least some of the ionized atoms with a fourth probe laser after the illuminating at least some of the ionized atoms with the third probe laser.

In preferred embodiments, the method is continuous, utilizing a continuously moving atom beam (rather than stationary, trapped atoms) and a continuous-wave laser array with continuous interrogation. Reference to the atoms is continuously made as the atom beam passes through the cascade of laser beams, allowing direct fast-locking to the atomic transition. The use of an optical transition results in a higher resonance quality factor than RF transitions. The result of a continuous method is continuous fast readout of optical transitions, which is a significant benefit for next-generation timing solutions.

In some methods, the stable frequency reference is an optical frequency reference. In some methods, the stable frequency reference is a microwave frequency reference.

Some methods utilize an interferometric frequency-reference apparatus comprising: a vacuum chamber; an atom source configured to supply neutral atoms to be ionized; an ionizer configured to excite the neutral atoms to form ionized atoms; an ion collimator configured to form a collimated beam of the ionized atoms; one or more probe lasers; and a readout laser configured to determine a ground-state population of the ionized atoms, wherein the atom source, the ionizer, and the ion collimator are disposed within the vacuum chamber.

DETAILED DESCRIPTION OF EMBODIMENTS OF THE INVENTION

Figure 1A:
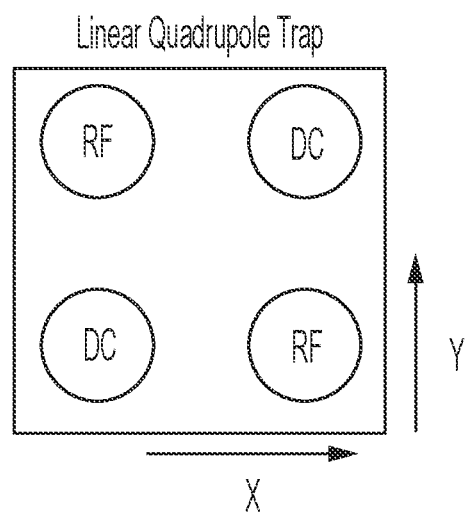
FIG. 1A is a cross-section schematic of a linear quadrupole trap configured with rods.

The apparatus, methods, and systems of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phrase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

In some variations, the present invention provides an ion-based frequency reference that provides an optical frequency standard with extremely high levels of stability and with fast, continuous readout, in a compact package. The invention is predicated, at least in part, on a Ramsey-Bordé interferometer. A Ramsey-Bordé interferometer involves a linear stream of atoms probed by a well-defined sequence of oscillatory fields. In the present invention, instead of using hot neutral atoms, a collimated stream of cooled, guided ions is employed. The ions may be guided by a specially designed radio-frequency (RF) Paul trap or a mass filter designed precisely for this purpose. By employing a cooled, controlled stream of ions, a combination of features not available with any other frequency reference may be realized: (i) very low fractional frequency instability, (ii) fast, continuous readout, (iii) compact size due to reduced atom velocity, and/or (iv) reduced vacuum requirements due to deep trap depth.

To the knowledge of the present inventors, Ramsey-Bordé interferometry on a stream of cooled ions has not heretofore been accomplished. As described herein, Ramsey-Bordé interferometry on a stream of cooled ions is performed with a high signal-to-noise ratio by utilizing an ion collimator, such as an engineered RF-Paul trap/mass filter, that collimates the cooled ions and confines them to a one-dimensional stream. In this disclosure, "trap/filter" is synonymous with "ion collimator". The trap/filter is configured to optimize the fractional frequency instability and the size, weight, and power of the device. The trap/filter controls the ion propagation velocity, thus significantly reducing dimensional requirements, Doppler error, and transit time error. The trap/filter also provides a deep trapping potential to relax vacuum requirements.

In this disclosure, "frequency reference" is synonymous with "interferometric frequency-reference apparatus" or like terms.

The stability and ultimate size of conventional Ramsey-Bordé interferometers are limited by Doppler contributions to the error (first and second order), and the transit-time broadening of the atomic species in relation to the laser beams. Historically, Ramsey-Bordé spectroscopy uses a beam of neutral atoms transiting an array of four lasers. The neutral atom beam, used in the historical implementation, is replaced—according to this invention—with a collimated ion beam. The applied electric field of the trap/filter allows for precise velocity control, as well as controlled density and spacing of the ions. This novel use of an ion beam significantly may decrease Doppler broadening and Ramsey-Bordé transit-time broadening suffered by the conventional neutral-atom approach. Controlled ion-beam velocity also may enable long Ramsey-Bordé transit times to be achieved without sacrificing size and power requirements.

To date, atom-based frequency references (both RF and optical) employ trapped atoms whose transitions are probed via low-duty rate (on the order of Hz), long-integration time spectroscopy. Reference to the atoms can necessarily be made only once per pulse sequence, resulting in atom feedback that is very slow, on the order of seconds. By contrast, the present invention preferably utilizes a continuously moving atom beam (rather than stationary, trapped atoms) and a continuous-wave laser array with continuous interrogation. Reference to the atoms is continuously made as the atom beam passes through the cascade of laser beams, allowing direct fast-locking to the atomic transition. The use of an optical transition results in a higher resonance quality factor than RF transitions. The result of a continuous method is continuous fast readout of optical transitions, which is a significant benefit for next-generation timing solutions.

The frequency reference disclosed herein is enabled by the generation of an ultranarrow-linewidth laser. The frequency reference can be used to lock a laser source for precision sensing/timing applications. The frequency reference can be used as an ultra-stable optical frequency reference to which an external laser can be locked, via a standard beat-note lock, for use by other optical, quantum, metrology, or communication instruments.

The present invention, in some variations, provides a fieldable (e.g., on the order of 10 cm long) interferometric frequency-reference apparatus with a stability competitive with conventional atomic clocks, operable at shorter averaging times, and with drift resistance greater than state-of-the-art cryogenic optical cavities.

While the disclosed device (interferometric frequency-reference apparatus) may fill the niche of traditional stable oscillators, the device has other applications enabled by the realization of an ultra-stable laser. One application is for precision sensing. An example of precision sensing is forensic seismology using undersea fiber-optic cables for standoff blast detection, where traditional seismometers are unavailable or impractical.

The present invention, in some variations, provides a compact frequency reference with low fractional frequency instability (low Allan deviation) with fast continuous readout. Allan variance is the most common statistical function used to characterize and classify frequency fluctuations of a frequency reference. See Allan, Statistics of Atomic Frequency Standards, *PROCEEDINGS OF THE IEEE* Vol. 54, No. 2, 1966, which is incorporated by reference. The Allan deviation ("ADEV") is the square root of the Allan variance. ADEV is used to characterize the random deviations which are related to the noise in the frequency. While there are other ways to define fractional frequency instability including modified Allan deviation, in this disclosure, "fractional frequency instability" means the unitless Allan deviation, ADEV, defined above.

The present invention, in various embodiments, provides multiple benefits over prior and state-of-art optical frequency references. The frequency reference is fundamentally limited only by atomic properties and therefore is capable of long-term averaging, unlike cavities as passive optical resonators. The limit of fractional frequency stability is therefore the fundamental stability limit of about $10^{-18}$ (ADEV), dictated by quantum physics.

The frequency reference disclosed herein does not require cryogenic operation or any cryogenic components.

Unlike conventional optical clocks, the frequency reference has fast readout without the need for systematic calibration.

With cooled atoms, the propagation length of the atomic beam can be proportionally reduced as the beam size is set by the velocity of the atoms relative to the intrinsic atomic quadrupole linewidth.

By using trapped ions instead of neutral atoms, a higher degree of control may be realized for the atomic velocity distribution. Exemplary ion-trap/filter geometries include a linear filter and a racetrack trap geometry. A linear filter is conceptually simpler, while a racetrack trap geometry enables cancelling residual Doppler broadening, and may be useful to turn off the atomic sources for recycling the ions.

The conventional frequency references with the lowest fractional frequency instability to date are optical atomic clocks. They hold the world record in fractional frequency instability which is on the order of $10^{-18}$. However, the extreme complexity and massive size/weight/power requirements disqualify optical atomic clocks for practical deployment. Furthermore, optical atomic clocks require their lasers to be locked to large (~40 cm long) or cryogenic optical cavities. The laser locking narrows the laser linewidth and provides an electromagnetic source (the laser) as a stable optical oscillator. However, the optical cavities are large, operate at their fundamental limits, and do not achieve long-term stability sufficient to enable standalone operation without an optical atomic clock. There have been a few demonstrations of atomic-based frequency references but they are physically large because their size is set by the atomic velocity distribution and/or cryogenic operation. Any attempt to miniaturize lab-scale optical atomic clocks must solve the requirement of optical frequency references in order to operate.

Most fieldable frequency references are high-quality-factor radio-frequency cavities—e.g., oven-controlled crystal oscillators (OCXOs)—which are interfaced with standard electronics. While appealing in terms of size/weight/power requirements, such frequency references are based on a material like quartz that experiences long-term drifts and cannot be used in situations where long-term stability is required (ADEV≈$10^{-10}$-$10^{-13}$).

For applications requiring timing and long-term stability superior to OCXOs while maintaining deployability (e.g., Global Positioning System applications), warm radio-frequency atomic clocks are used. However, these clocks are still complex, requiring their own separate precision oscillator just to read them out which is limited to very long time-scales. Subsequently, chip-scale atomic clocks are almost always paired with their own highly stable frequency reference. Yet, their performance is still on the order of ADEV≈$10^{-13}$ on short time scales, and only improving on long time-scales such as greater than 100 seconds.

In preferred embodiments, a significant difference between the disclosed frequency reference compared to state-of-art Ramsey-Bordé interferometers or atomic clocks is that the hot neutral atoms in an interferometer, or cold trapped atoms in a clock, are replaced with a continuously moving ion beam.

Another significant difference with conventional art is that, in preferred embodiments, the disclosed frequency reference replaces pulsed lasers (in a clock) with a sequence of spatially separated continuous-wave lasers. By implementing a Ramsey-Bordé interferometer in a guided-ion (collimated) system, a continuous beam of atoms is used for fast readout while avoiding the velocity distribution problems of neutral atoms.

Another difference with conventional art is that the disclosed frequency reference, in preferred embodiments, greatly relaxes the requirements for complex cooling procedures. Preferred frequency references employ minimal laser cooling and then trapping/guiding ions in a deep radio-frequency (RF) potential field. Deeper traps can be made with the RF-Paul trap than with typical magnetic-field traps needed for neutral atoms. Further, deep RF-Paul traps allow for control of propagation velocity. Preferred methods exclusively utilize radio-frequency and direct-current fields, thereby requiring fewer lasers. The disclosed frequency reference is compatible with solid-state paths to integration, and is more amenable to miniaturization.

In some variations, an interferometric frequency-reference apparatus comprises:
 a vacuum chamber;
 an atom source configured to supply neutral atoms to be ionized;

an ionizer configured to excite the neutral atoms to form ionized atoms (such as, but not limited to, $Ca^+$ or $Sr^+$);

an ion collimator configured to form a collimated beam of the ionized atoms;

one or more probe lasers; and a readout laser configured to determine a ground-state population of the ionized atoms, wherein the atom source, the ionizer, and the ion collimator are disposed within the vacuum chamber.

In some embodiments, the atom source is a solid-state electrochemical atom source. Integration with a solid-state electrochemical atomic beam source can reduce size, weight, and power as the frequency reference is smaller, is more power-efficient, and provides a collimated beam when compared to conventional atomic ovens.

In some embodiments, the ionizer is disposed inside the ion collimator. In these embodiments, the ionized atoms are formed within the ion collimator. In other embodiments, the ionizer is disposed outside the ion collimator. In these embodiments, the ionized atoms are formed and then injected into the ion collimator.

Figure 1B:
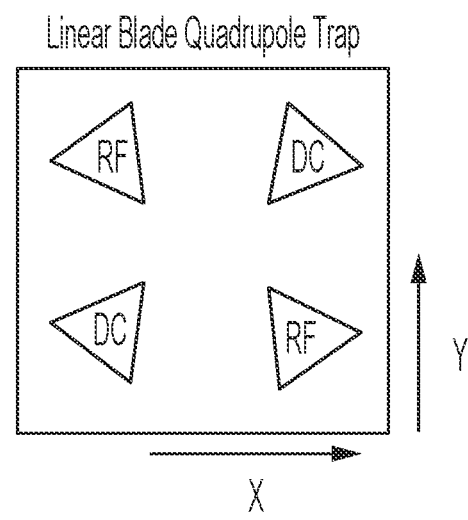
FIG. 1B is a cross-section schematic of a linear quadrupole trap configured with blades.
Figure 2:
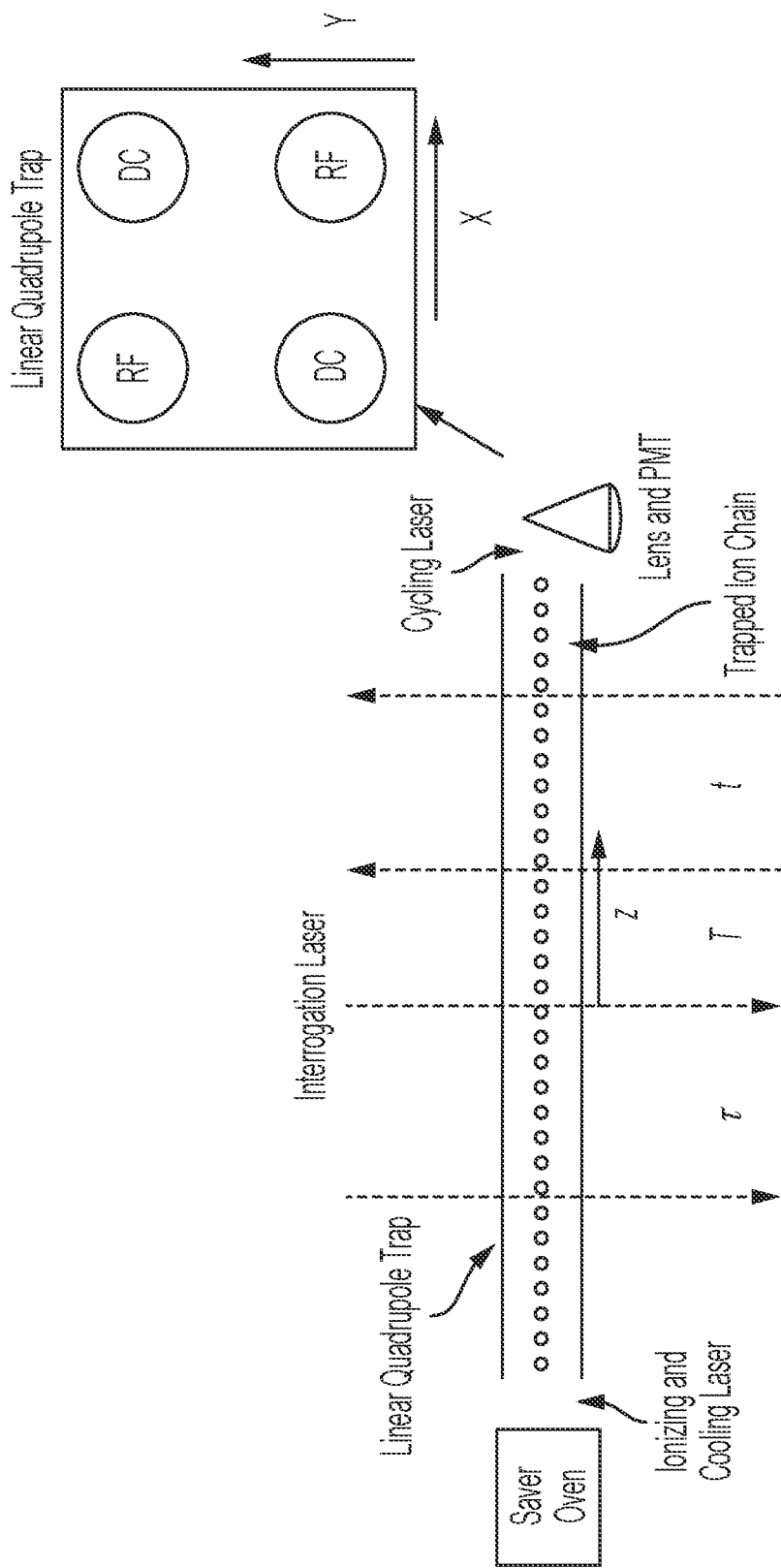
FIG. 2 is a top view of a linear ion collimator, in some embodiments.

In some embodiments, the ion collimator is a linear collimator. A linear collimator may be selected from the group consisting of a linear quadrupole trap, a Penning trap, a surface ion trap, and a mass filter, for example. FIG. 1A is a cross-section schematic of a linear quadrupole trap configured with rods. FIG. 1B is a cross-section schematic of a linear quadrupole trap configured with blades. FIG. 2 is a top view of a linear ion collimator, in some embodiments.

Figure 3:
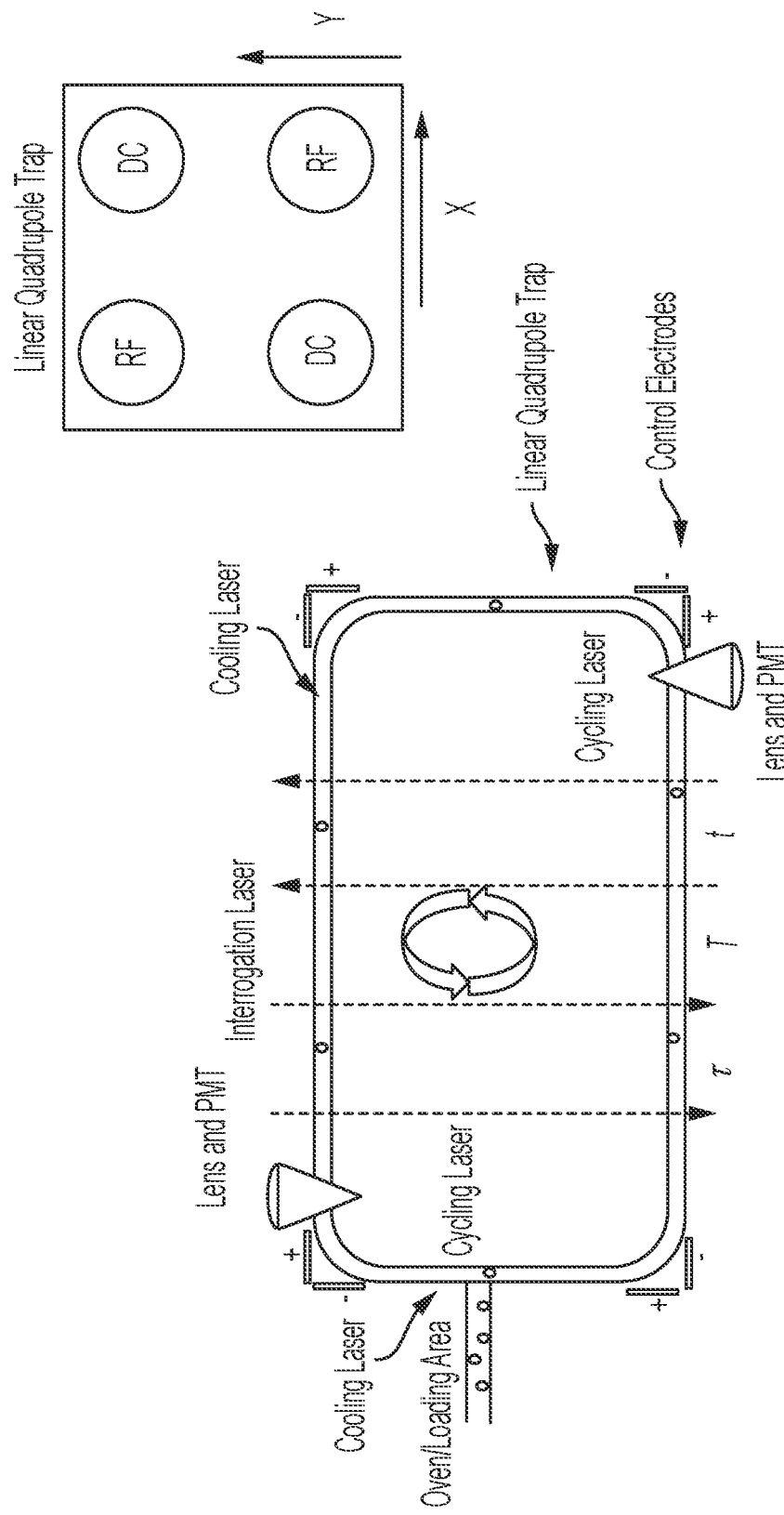
FIG. 3 is a top view of a non-linear ion collimator, in some embodiments.

In other embodiments, the ion collimator is a non-linear collimator. A non-linear collimator may be in a recirculating configuration, such as a racetrack configuration (e.g., see FIG. 3), a ring, or a tortuous loop, for example. FIG. 3 is a top view of a non-linear ion collimator, in some embodiments.

The ion collimator may be configured such that the collimated beam of the ionized atoms has a beam waist selected from about 10 nanometers to about 10 meters. Preferably, the beam waist is selected from about 50 nanometers to about 500 nanometers. The ion collimator may be configured such that the collimated beam of the ionized atoms has a beam velocity selected from about 1 µm/s to about 0.99c, where c is the speed of light in vacuum. Preferably, the beam velocity is selected from about 1 m/s to about 20 m/s.

In some embodiments, one or more probe lasers are configured for Ramsey spectroscopy on the ionized atoms. In preferred embodiments, all probe lasers present are configured for Ramsey spectroscopy on the ionized atoms. The number of probe lasers may vary but is preferably two or more, such as four probe lasers (e.g., see FIG. 4).

In some embodiments, the one or more probe lasers are configured to probe quadrupole or both dipole and quadrupole transitions of the ionized atoms. Configuring includes selecting proper wavelength and ensuring sufficiently narrow linewidth.

In some embodiments, the readout laser is a Doppler laser configured to perform a quantum-jump measurement to determine the ground state population, post-Ramsey interrogation, via fluorescence from a S→P cycling transition.

In some embodiments, the interferometric frequency-reference apparatus further comprises a cooling laser. The cooling laser is configured to cool the ionized atoms in preparation for Ramsey spectroscopy. In certain embodiments, the readout laser is itself configured for cooling, and there is not necessarily a physically distinct cooling laser.

The interferometric frequency-reference apparatus may further comprise an injection electrode. The injection electrode is different from the ionizer. An injection electrode may create an electric potential field that directs ionized atoms into the ion collimator, in embodiments wherein atoms are ionized outside the ion collimator. In preferred embodiments, atoms are ionized within the ion collimator; therefore, an injection electrode is not necessary.

The interferometric frequency-reference apparatus may further comprise an ion sink configured to collect the ionized atoms exiting the ion collimator. The ion sink, if present, is preferably disposed within the vacuum chamber.

The interferometric frequency-reference apparatus preferably further comprises an imaging system configured to focus fluorescence from the ionized atoms. The imaging system may include an optical lens or system of lenses, a camera, a photomultiplier tube, and/or a photon bucket detector.

Figure 4:
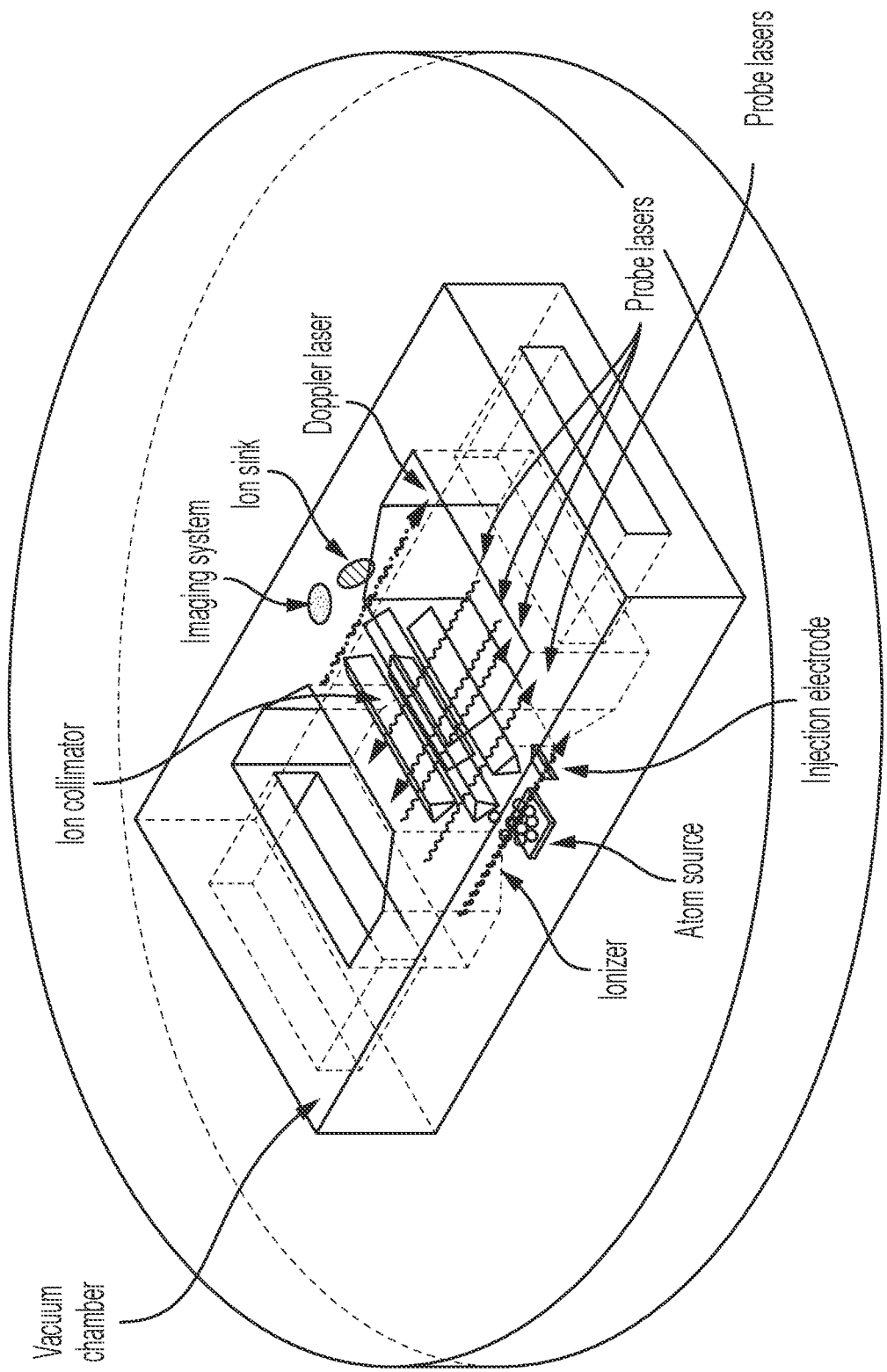
FIG. 4 is a schematic of an interferometric frequency-reference apparatus, in some variations.

FIG. 4 is a schematic of the interferometric frequency-reference apparatus, in some variations. The frequency reference shown in FIG. 4 includes a vacuum chamber, an atom source, an ionizer, an ion collimator, an injection electrode, an ion sink, four probe lasers, a Doppler laser (generally, a readout laser), and an imaging system. The injection electrode and the imaging system are optional components.

In certain embodiments, an interferometric frequency-reference precursor apparatus is provided without the vacuum chamber. At a later time, the precursor apparatus is situated within a vacuum chamber. The interferometric frequency-reference precursor apparatus, prior to disposition within a vacuum chamber, comprises:

an atom source configured to supply neutral atoms to be ionized;

an ionizer configured to excite the neutral atoms to form ionized atoms (such as, but not limited to, $Ca^+$ or $Sr^+$);

an ion collimator configured to form a collimated beam of the ionized atoms; one or more probe lasers; and a readout laser configured to determine a ground-state population of the ionized atoms.

The interferometric frequency-reference apparatus provides an optical frequency reference, in some embodiments. The interferometric frequency-reference apparatus provides a microwave frequency reference, in some embodiments.

Other variations of the invention provide a method of creating a stable frequency reference, the method comprising:

(a) creating an atomic vapor;

(b) ionizing at least some atoms in the atomic vapor, to form ionized atoms;

(c) collimating the ionized atoms in an ion collimator, to form a collimated beam of the ionized atoms;

(d) optionally, illuminating some of the ionized atoms with a cooling laser;

(e) illuminating at least some of the ionized atoms with a first probe laser at a first-probe-laser frequency;

(f) illuminating at least some of the ionized atoms with a second probe laser at a second-probe-laser frequency;

(g) adjusting the first-probe-laser frequency and the second-probe-laser frequency using Ramsey spectroscopy to an S→D transition of at least some of the ionized atoms; and (h) illuminating at least some of the ionized atoms with a readout laser to determine a ground-state population of the ionized atoms.

Figure 5:
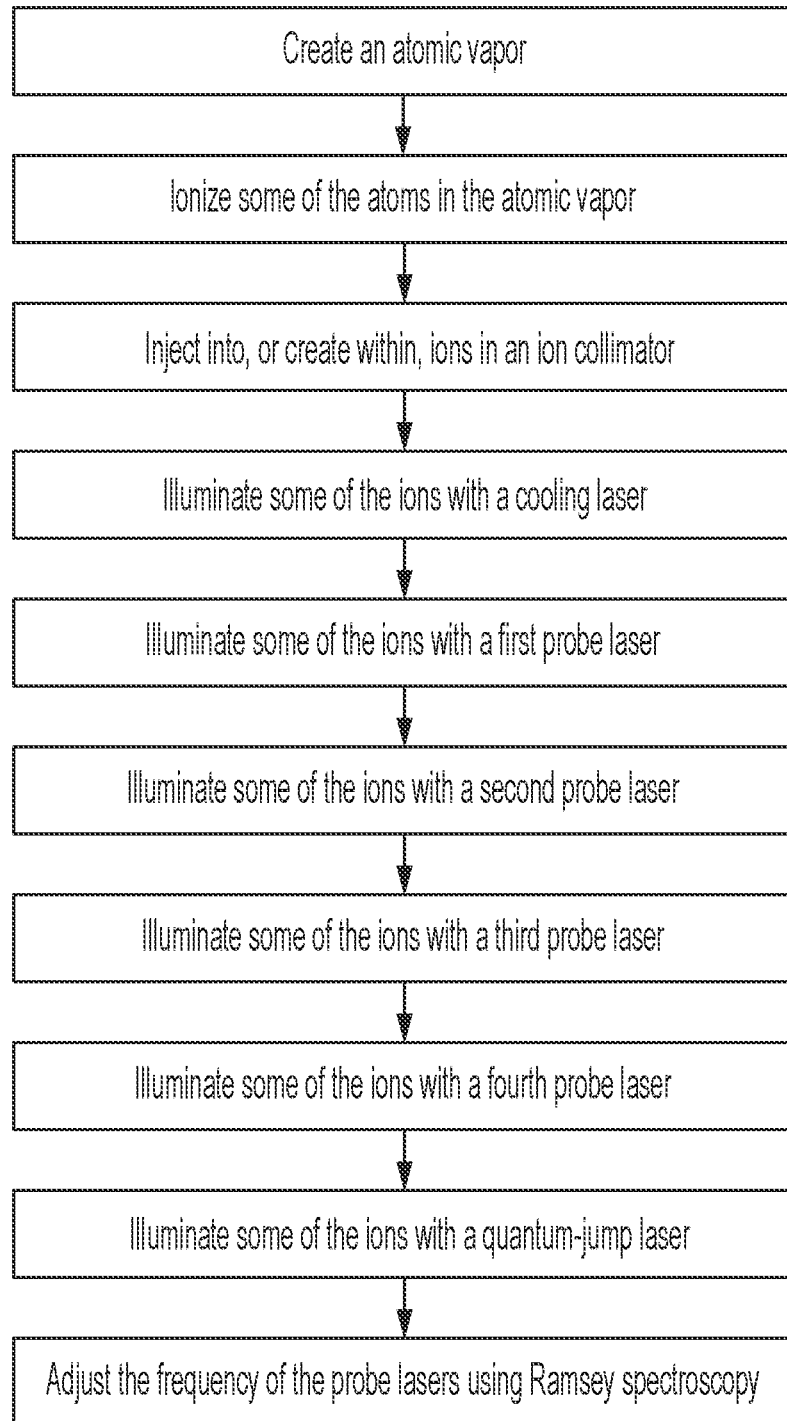
FIG. 5 is a method flowchart, in some embodiments.

FIG. 5 depicts a method flowchart, in some embodiments. The steps of illuminating ions with a cooling laser, illuminating ions with a third probe laser, and illuminating ions with a fourth probe laser, are optional. The readout laser may be a Doppler laser. The step of illuminating ions with a Doppler laser (or other readout laser) may be performed before or after the step of adjusting the frequency of the probe lasers using Ramsey spectroscopy.

In some methods, the atomic vapor and/or the ionized atoms are obtained from a solid-state electrochemical atom source. The ionized atoms may be $Ca^+$ and/or $Sr^+$, in some embodiments. Solid-state electrochemical atom sources are described in more detail later in this detailed description.

The ionized atoms provided in step (b) may be formed within the ion collimator provided in step (c). Alternatively, or additionally, the ionized atoms provided in step (b) are formed and then injected into the ion collimator. Steps (b) and (c) may be integrated such that at least some of the ionizing occurs inside ion collimator. In some preferred embodiments, steps (b) and (c) may be integrated such that all of the ionizing occurs inside ion collimator.

In some methods, step (d) is conducted to cool the ionized atoms in preparation for the Ramsey spectroscopy. The cooling may employ the same laser as the readout laser (in which case it also is a cooling laser), or the cooling may employ a physically distinct laser.

In some methods, the ion collimator is a linear collimator. For example, the ion collimator may be a linear collimator selected from the group consisting of a linear quadrupole trap, a Penning trap, a surface ion trap, and a mass filter. In other methods, the ion collimator is a non-linear collimator. For example, the ion collimator may be a non-linear collimator selected from the group consisting of a racetrack configuration, a ring, a tortuous loop, or another recirculating configuration.

The collimated beam of the ionized atoms may have a beam waist selected from about 10 nanometers to about 10 meters, such as from about 50 nanometers to about 500 nanometers. The collimated beam of the ionized atoms may have a beam velocity selected from about 1 μm/s to about 0.99c, such as from about 1 m/s to about 20 m/s, where c is the speed of light in vacuum.

In some embodiments, the method further comprises illuminating at least some of the ionized atoms with a third probe laser. In certain embodiments, the method further comprises illuminating at least some of the ionized atoms with a fourth probe laser after the illuminating at least some of the ionized atoms with the third probe laser.

In some methods, the stable frequency reference is an optical frequency reference. In some methods, the stable frequency reference is a microwave frequency reference.

Some methods utilize an interferometric frequency-reference apparatus comprising: a vacuum chamber; an atom source configured to supply neutral atoms to be ionized; an ionizer configured to excite the neutral atoms to form ionized atoms; an ion collimator configured to form a collimated beam of the ionized atoms; one or more probe lasers; and a readout laser configured to determine a ground-state population of the ionized atoms, wherein the atom source, the ionizer, and the ion collimator are disposed within the vacuum chamber.

Some variations will now be further described in greater detail, it being understood that such description is non-limiting and that the present invention is not limited by any hypotheses or theories.

The interferometric frequency-reference apparatus is a device that Ramsey-interrogates a collimated ion beam to directly fast-feedback-lock an ultra-stable laser. Reference is made to FIG. 4 showing components and optional components.

The vacuum chamber houses the atom source, the ion sink, the ionizer, and an ion collimator such as a modified RF ion Paul filter/trap. Since the ions are collimated, and not trapped per se, the requirements for ultra-high vacuum (to reduce background collisions) are relaxed compared to conventional ion trapping. The vacuum level may be moderate, such as a chamber pressure in the range of about $10^{-5}$ torr to about $10^{-8}$ torr. The laser array and the imaging system may be placed inside or outside the vacuum chamber, depending on whether these components are compact. The vacuum chamber may be a standard off-the-shelf (e.g. stainless steel) chamber or may be a custom-built vacuum chamber from stainless steel, aluminum, borosilicate glass, aluminosilicate glass, sapphire, or a combination thereof, for example.

The atom source supplies a stream of neutral atoms to be ionized. The stream of neutral atoms is in a vapor phase containing the atoms. The atom source may be positioned at or near the entrance of the ion collimator. The atom source may be a separate chamber with a conductance restriction with its aperture near the ionizer, a SAES dispenser, a pill dispenser, an alfasource dispenser, a liquid or solid phase of the atoms (possibly mixed with other species), a LIAD (light induced atomic desorption) source, a graphite (or other) intercalation compound of the atoms, or an electrochemical solid-state source, for example. See the section entitled Solid-State Electrochemical Atom Sources later in this specification, regarding embodiments of electrochemical solid-state atom sources that may be utilized in the frequency reference herein. The neutral atoms to be ionized may be selected from the group consisting of Ca, Sr, Yb, Li, Na, K, Rb, Cs, Hg, and combinations thereof, for example. In some embodiments, the atoms are Ca and/or Sr, as single-electron ionization of calcium or strontium results in hydrogenic ions with a broad cycling dipole transition and a narrow quadrupole transition, both easily addressable by commercial lasers. The atomic species may be isotopically enriched relative to its natural isotopic abundance.

The ionizer excites the neutral atoms, promoting a valence electron from the atom to the continuum and leaving behind an ion, such as a hydrogenic ion. The ionizer may employ photoionization, i.e. ionization produced by the action of electromagnetic radiation (e.g., optical radiation). Some embodiments employ two-photon optical ionization, in which an ECDL (external cavity diode laser) is tuned to the neutral atoms' electric dipole transition (S→P), exciting a valence electron from the ground S state to an excited P state. From there, a second ECDL promotes the P-state electron to the continuum. Both laser beams are preferably focused near the entrance of the ion collimator. Optical ionization allows isotope selection: the first ECDL may be frequency-tuned to selectively ionize one out of multiple naturally occurring isotopes in the atomic sample (typical isotope shifts are large, on the order of GHz—easily addressable by a MHz-broad laser). Frequency tuning may be accomplished by a loose, easily engineered DAVLL (dichroic atomic vapor laser lock) lock to a vapor cell filled with the neutral atoms. The second ECDL need not be frequency-stabilized at all. The disadvantage of this method is the need for a dedicated ionizing laser (the first S→P laser). The second, P→continuum laser may simultaneously be used as a readout laser.

Alternatively, or additionally, the ionizer may employ electrical ionization. With electrical ionization, a small current-carrying filament may be placed near the neutral atom beam leaving the atom source, to excite a valence electron directly into the continuum. While this technique obviates the need for a dedicated ionizing laser, there is not selectivity for certain isotopes. Thus, an isotopically enriched atom source would be required, if it is desired for the frequency reference to utilize isotopically enriched atoms. Electrical ionization tends to be the preferred ionization technique when prioritizing size, weight, and power requirements.

The ion collimator (trap) is used to collimate the ionized atoms into a one-dimensional, velocity-controlled beam. The collimated beam travels along the length of the trap, through a sequence of spatially separated lasers for cooling, Ramsey interrogation, and readout. The ion collimator may be a modified RF ion mass filter. In some embodiments, the ion collimator contains the ionizer within the ion collimator. In other embodiments, the ion collimator receives ions separately generated by an ionizer that is physically disposed outside the ion collimator.

Many geometries of ion collimators may be used. A linear collimator may be a modified RF ion mass filter, with four parallel (e.g. tungsten) rods (FIG. 1A) or blades (FIG. 1). Two of the rods/blades support MHz RF, such as supplied by an amplified RF function generator, while the other two rods/blades are held at direct current (DC), tied to a digital-to-analog converter. This standard configuration provides longitudinal trapping (x, y), ensuring that the ion beam remains collimated into a one-dimensional crystal axially (z). The DC rods may be segmented (with different DC voltages) to provide transport control of the ion beam axially. In this way, the ion beam may be continuously transported along the collimator with a well-controlled velocity distribution. This velocity control is very beneficial when the frequency reference is an ultra-narrow frequency reference.

Unlike a conventional RF ion trap, the linear collimator preferably does not include DC endcaps that would cause harmonic axial trapping. Instead, the ion collimator produces a slow-moving ion beam, which is not trapped in all three dimensions. The linear design of the ion collimator may be similar to ion-based mass filters, which normally operate in high vacuum ranges. However, because long trap lifetimes are not required, the vacuum level may be relaxed compared to typical ion traps.

The rods/blades of the ion collimator may be machined and aligned in a (e.g. Macor) support structure, such as a structure fabricated from Macor® machinable glass ceramic (Corning Incorporated, Corning, New York, USA). The rods/blades may be fabricated from metal deposited in strips onto the walls of a hollowed-out, machined (e.g. laser-machined) part, such as a piece of fused silica. Typical sizes are about 30 cm×10 cm×10 cm for a Macor structure, and about 10 cm×3 cm×1 mm for a laser-machined system. If stability and simplicity is a priority, then the smaller laser-machined design is preferred.

The ion collimator may be a non-linear collimator, such as a racetrack collimator. A racetrack collimator (see FIG. 3) essentially bends the linear collimator and connects the ends together to form a racetrack shape. In this configuration, residual Doppler shifts may be cancelled by interrogating two opposite-momentum ion beams. A racetrack collimator, or other recirculating configuration, may utilize a commercial ion pump to maintain vacuum. Ion collimators with recirculating configurations provide long atom-source lifetimes.

Ions leaving the ion collimator may be collected by an ion sink for recycling. The ion sink is an optional component which may be especially beneficial in the case of a linear collimator. The ion sink may be positioned on the output port of the ion collimator to collect the ion beam after use. The ion sink may be an electrochemical solid-state atom sink, which may be similar to an electrochemical solid-state atom source but designed to act as an atom sink. In certain embodiments, the atom source is repurposed as an ion sink, which may significantly increase the lifetime of the device. For example, upon depletion of the atom source, the ion sink may be repurposed as the new source, directing an atom beam in the opposite direction along the ion collimator. The ion beam may then be collected by the original atom source (now itself repurposed as an ion sink).

Other implementations of an atom sink include, but are not limited to, a graphite intercalation compound, a mixture of the atomic species with alkali or alkaline earth metals, or a cold surface. The atom sink, once it contains a high amount of absorbed, adsorbed, or intercalated atoms, may then be heated to release the atomic species of interest. The initial atom source may be cooled to turn it into an atom sink, thereby reversing the flow of atoms and ions, permitting reuse of atoms, and enabling a longer device lifetime and/or a smaller atom source size.

A laser array includes an optional cooling laser, one or more probe lasers, and a Doppler laser functioning as a readout laser. The laser array is preferably arranged orthogonally to the propagation direction of the ions. The laser array is configured to perform a Ramsey interrogation sequence on the ion beam as the ions move through the ion collimator.

A Doppler laser, or other cooling laser, may be used to initialize the ion beam into the S state in preparation for Ramsey interrogation. Slightly red-detuned with respect to a S→P electric dipole transition of the ion (a broad cycling transition with high scattering rate), the Doppler laser cools the ion beam to the Doppler limit (e.g., a temperature of about 70 mK) and into the Lamb-Dicke regime where first-order Doppler shifts are separable into motional sidebands. The laser may be a small external-cavity diode laser (ECDL) of intermediate power (a few mW), locked to prevent accidental blue-detuned heating of the ions. A small commercial cavity, with a Pound-Drever-Hall (PDH) lock, may be used for this purpose. Depending on the atom species chosen, one or more red-wavelength repump lasers may also be utilized to keep the ion in the Doppler cooling cycle. Such repump lasers have even less stringent power and locking requirements; an inexpensive distributed feedback (DFB) laser may be used, locked only to a slow wavemeter.

A probe laser is locked to a narrow transition in the ion via optical Ramsey spectroscopy. In the case of $Ca^+$ or $Sr^+$, the narrow transition is a ~Hz-wide electric quadrupole S→D transition. Quadruple transitions are clock transitions, do not emit light very well, have long coherence, and have high quality factor (Q). In order to perform spectroscopy with enough precision to resolve the Ramsey fringe pattern, the laser is preferably pre-stabilized, narrowed to ~kHz laser linewidth via a PDH lock to an ultralow-expansion (ULE) cavity. Note that this cavity need not be narrowed to laser linewidths of mHz. To sweep the laser frequency, a small amount of tuning (100s of kHz) is enabled by directing the probe laser beam, post-lock, through an acoustic-optical modulator (AOM).

Table 1 below lists laser wavelengths for cooling/detection, quadrupole transition, and repumping for $Sr^+$ and $Ca^+$ ions, in exemplary embodiments.

TABLE 1

Laser Wavelengths for Strontium and Calcium Ions Used
in an Interferometric Frequency-Reference Apparatus.

|  | $Sr^+$ | $Ca^+$ |
|---|---|---|
| Cooling/Detection | 421.7 nm | 396.8 nm |
| Repump 1 | 1091.5 nm | 866.2 nm |
| Repump 2 | 1033 nm | 729 nm |
| Quadrupole | 674 nm | 854 nm |

Both a Ramsey and a Ramsey-Bordé spectroscopy sequence are available for operation of the device. The Ramsey sequence may be understood as consisting of only the first two pulses from a Ramsey-Bordé pulse sequence. A Ramsey-Bordé spectroscopy sequence is now detailed, as it is seen by the ions in their own reference frame as they pass through continuous-wave laser array. In the ions' frame of reference, the sequence consists of four coherent π/2 pulses, all preferably at the same frequency.

(1) The first π/2 pulse promotes the ion from the S state to a coherent superposition of S and D states. After the π/2 pulse, the ion evolves freely for some time τ, which may be referred to as the Ramsey interrogation time. If measured in a rotating frame during this time, a phase delay between the local oscillator (the probe laser) and the rotation of the state vector in the Bloch sphere will develop, if and only if the probe laser is detuned from the atomic transition.

(2) The second π/2 pulse is pulsed at the end of the Ramsey interrogation time t. Depending on the phase delay acquired during the interrogation time, the ion will return to the ground state S with well-defined probability or will be excited to the D state.

(3) The third π/2 pulse is a counter-propagating pulse that excites the ion after the first Ramsey interrogation time with a small delay T. This π/2 pulse causes the atom to again become a coherent superposition of S and D states during time t. However, it now acquires a phase that is negative with respect to the first interrogation time τ. This stimulates echo, effectively canceling low-frequency dephasing from unwanted noise sources. It is a well-known technique, often called a stimulated photon echo, which is an optical analog of a stimulated spin echo. Preferable, it is ensured that τ=t for all measurements.

Preferably, the first, second, and third π/2 pulses remain maximally phase-coherent. Otherwise, phase jitter of the probe laser with respect to the ion beam—due to acoustic vibration physically moving the laser output and possibly causing Doppler shifts—can significantly diminish Ramsey fringe contrast. As such, in preferred embodiments, the phase stability of the laser beam path is actively stabilized via a small Mach-Zehnder (MZ) beam-splitter interferometer.

(4) A fourth and final π/2 pulse converts the ion into either an S or D state. The probability of becoming excited (D state) or unexcited (S state) is determined by the phase acquired during the Ramsey interrogation (τ, t) times. As a population state, readout is determined by measuring fluorescence realized by the cycling/Doppler laser. Since the probability of being in the S or D state is in part a function of the probe laser's detuning from the atomic transition, sweeping the probe laser frequency via the post-lock AOM discussed above leads to the appearance of Ramsey fringes, to which the probe laser can be locked (locking electronics are discussed below).

In some embodiments, the velocity distribution of the ion beam is delta-function-like to ensure constant Ramsey interrogation time τ, from ion to ion, thereby minimizing loss of Ramsey fringe contrast. Also note that the fringe features have a width 1/τ, so τ is preferably as long as possible, limited by decoherence times and readout speed and lock bandwidth. The velocity control of the ion beam provided by the ion collimator is a substantial benefit.

A readout laser is employed to perform a quantum-jump measurement in order to determine the ground state population, post-Ramsey interrogation. The readout laser may be the same Doppler laser that was used for cooling, via a beam split, or may be a different Doppler laser. The quantum-jump measurement utilizes fluorescence from the S→P cycling transition. If the measurement collapses the ion's wavefunction into the S ground state, then the ion will cycle on the S→P transition and will fluoresce. Otherwise, if the wave function collapses to the excited D state, then the ion will be outside the cycling transition and in a dark state. Repeated fluorescence measurements, using an imaging system, quickly gives a measure of the probability of a successful quantum jump.

The imaging system comprises a photomultiplier tube (PMT) and a lens to focus ion fluorescence onto the PMT aperture. Readout can either be taken as an average of ions as they pass by, or single-shot (ion-by-ion) with a field-programmable gate array to gate photon arrivals with ions as they pass. Ultimately, ion velocity and spacing will set the readout time, along with the cycling transition's scattering rate. The estimated readout time can be realized from the following equations. Consider the time for an ion to transit an ion mass filter. This is given by $T_{a1}=d_{RB}/V_{atoms}$ where $d_{RB}$ is the trap length and $V_{atoms}$ is the velocity of the ion beam. Subsequently, a second ion immediately following the first must be read out at a time $T_{a2}=d_{RB}/V_{atoms}+d_{atom}/V_{atoms}$ where $d_{atom}$ is the atom-atom spacing. Thus, the measurement update time is set by $T_m=d_{atom}/V_{atoms}$, i.e. it is the time between successive ion-ion measurements. An upper bound for the measurement time/bandwidth can be found by considering a 7.62-cm-long ion trap and a velocity of 76 m/s—this corresponds to $T_m$=65 nanoseconds, a rate of about 15 MHz ($1/T_m$). This would be the fastest rate at which the laser linewidth can be updated for readout. Note for $Ca^+$ and $Sr^+$, the cycling transition linewidth is about 20 MHz. Ultimately there is no benefit by having a faster ion-ion update rate beyond about 20 MHz, since the fastest a single ion can be read out is fundamentally set by this rate.

The interferometric frequency-reference apparatus is preferably configured with locking electronics for frequency locking, utilizing PID—Proportional (P), Integral (I), and Derivative (D) feedback control. A conventional operational amplifier, with feedback loop, may be used to keep the probe laser frequency-locked to a side of Ramsey fringe. Ramsey fringe width is set by 1/τ, and the narrower the fringe the tighter the lock (and thus the narrower the locked laser). However, the fringe must not be so narrow as to have a narrow lock range that can easily be unlocked. An input to the feedback loop may be the error, calculated as reading minus setpoint, where reading is the measured, calibrated quantum jump probability determined by the readout laser, and setpoint is determined in-circuit. An output to the feedback loop may be P×error+I, where I is the integral of error as a function of time. The feedback is conveyed to the acousto-optic modulator described above. In some embodiments, the feedback is also conveyed partially to the probe laser, depending on the type of laser.

The interferometric frequency-reference apparatus may include a residual amplitude modulation feedback system.

The interferometric frequency-reference apparatus may be configured to stabilize or polarize input light to an electro-optic modulator (EOM).

The interferometric frequency-reference apparatus has primarily been described as a standalone optical frequency reference. If desired operation is for an ultra-stable microwave frequency source, then a high-repetition-rate frequency comb (e.g., 10 GHz) is preferably locked to the ultra-stable narrow linewidth laser using a similar PID lock as disclosed above. The locking of a comb-line to the ultra-narrow linewidth transfers the stability of the narrow-linewidth laser to the frequency comb. In a fully self-referenced system, the rate at which the frequency comb's ~200 femtosecond pulses come out of the laser (a rate of about 10 GHz) becomes locked with the stability of the optical reference. The detection of these pulses on a photodiode creates an ultra-stable microwave frequency reference. Frequency combs may be purchased commercially for this purpose. Alternatively, two or more devices (as disclosed herein) may be used to perform frequency transfer. In some embodiments, a microwave frequency reference is generated by beating two independent devices against each other. The resulting beat note may have the relative stability of an optical frequency reference.

This invention is applicable to portable atomic instruments, sensors, and lasers. Current electronic-warfare systems would benefit from highly stable local oscillators which would enable analog-digital converters to operate at higher frequency and with more bits. Similarly, radar systems benefit from lower local oscillator noise enabling the detection of slow-moving objects and for SAR at higher or geosynchronous orbit. Additionally, there is a need for ultra-narrow lasers for standoff forensic seismology (blast detection) using underwater fiber optic cables.

The interferometric frequency-reference apparatus may be fabricated in a wide range of sizes, such as from about 1 $cm^3$ to about 100 $cm^3$ in total device volume, for example. In some embodiments, the size of the interferometric frequency-reference apparatus is less than 100 $cm^3$, less than 10 $cm^3$, or less than 1 $cm^3$.

The interferometric frequency-reference apparatus may be operated according to the following examples, which are by no means limiting.

In one example, the interferometric frequency-reference apparatus, with its output, is treated as a "black box" functioning as an ultra-stable laser. Ultra-stable lasers have a variety of applications in timing, sensing, and spectroscopy.

In another example, the interferometric frequency-reference apparatus is utilized for generating RF timing. Two or more of the devices may be used for RF clock generation by beating the output lasers against each other. The beat note will then contain the relative stability of the two devices, down-converted to a radio frequency.

Another method for generating an RF clock may be realized by locking an optical frequency comb to the ultra-stable laser. In this scenario, the repetition rate of the frequency comb serves as the RF clock with the stability of the ultra-stable laser transferred to the stability of the comb repetition rate.

The interferometric frequency-reference apparatus may be utilized as a stable clock. On a satellite, submarine, or other vehicle, a stable clock allows long times (years) for secure communication even in a GPS-denied environment. This contrasts with the existing state-of-art secure communication, which is only on a time scale of minutes.

For space-based radar, the disclosed interferometric frequency-reference apparatus—working as a stable clock—enables (i) the identification of slow-moving targets, (ii) the removal of clutter from radar return signals, (iii) the ability to have geosynchronous synthetic aperture radar (SAR) with millimeter resolution, and (iv) longer integration times for SAR satellites.

The disclosed interferometric frequency-reference apparatus may be an ultra-stable laser in optical atomic clocks. In optical atomic clocks, an ultra-stable laser is a critical component to optical atomic clock miniaturization. An ultra-stable laser acts to replace the cryogenic cavities used to generate stable lasers in state-of-art optical clocks.

The disclosed interferometric frequency-reference apparatus may be an ultra-stable laser in spectroscopy. In spectroscopy, an ultra-stable laser provides a tool to study vary narrow radioactive elements (nuclear transitions) by transferring its stability to another laser. As such, the device disclosed herein may be useful for nuclear state-of-matter experiments. Also, in spectroscopy, an ultra-stable laser locked to an atomic reference can act as an absolute frequency calibration source relevant for future astronomy experiments.

Solid-State Electrochemical Atom Sources

Some variations utilize an atomic-beam source device as a solid-state electrochemical atom source, wherein the atomic-beam source device comprises:
- a first electrode;
- a second electrode that is electrically isolated from the first electrode; and
- a first ion conductor interposed between the first electrode and the second electrode, wherein the first ion conductor is capable of transporting metal ions, and wherein the first ion conductor is in contact with the first electrode and with the second electrode.

The atoms that are emitted (as atomic vapor) from the atomic-beam source device may be alkali metal atoms, alkaline earth metal atoms, rare earth metal atoms, mercury, or a combination thereof. For example, the metal atoms may be selected from the group consisting of Rb, Cs, Ca, Na, K, Sr, Li, Yb, Hg, and combinations thereof. Other metal atoms may be emitted from the atomic-beam source device, including Si, Ga, Al, In, As, Sb, Ge, Sn, Pb, Mg, Ba, Te, Au, Pt, Cr, and Cd, for example.

A voltage may be applied for a given duration across two electrodes that are situated on opposite sides of the first ion conductor, to source atoms. The voltage polarity may be switched so that the atomic-beam source device becomes an atom sink. The voltage amplitude is selected to control the atom flux.

In various embodiments, the applied voltage between two electrodes is from about 0.01 V to about 100 V, such as from about 0.1 V to about 10 V. The device power input for sourcing metal atoms is preferably less than about 500 mW, more preferably less than about 200 mW, and most preferably less than about 100 mW.

An "electrode" is a region that is electrically conductive or includes one or more material phases that are themselves electrically conductive. The first electrode permits the conduction of electrons and is in contact with the first ion conductor (discussed below). The first electrode permits (a) conduction of the same ionic species as conducted by the first ion conductor, (b) diffusion of a reduced form of the same ionic species as conducted by the first ion conductor, or both (a) and (b).

In some embodiments, the first electrode is a porous electrically conductive structure. In some embodiments, the first electrode is a selectively permeable electrically conductive layer. For example, see U.S. Pat. No. 10,545,461 to Roper et al, which is incorporated by reference herein. In this patent application, "selectively permeable" refers to the transport of metal atoms through the electrode, by diffusion or conduction. In some embodiments, the first electrode is a mixed ion-electron conductor. For example, see U.S. Pat. No. 10,828,618 to Roper et al, which is incorporated by reference herein.

The first electrode is preferably a porous electrically conductive layer. The porous electrically conductive layer is preferably a patterned metal layer directly on one surface of the first ion conductor. The metal layer is preferably thin, such as less than 1 micron in thickness, more preferably less than 200 nanometers or less than 100 nanometers in thickness. The pattern of the metal layer is preferably such that metal regions are closely spaced, such as less than 100-micron line pitch, more preferably less than 10-micron line pitch, and most preferably less than 2-micron line pitch. The metal layer may be patterned with photolithography, electron-beam lithography, direct-write lithography, direct-write metal deposition (e.g., ion beam-induced deposition), interference lithography, etc.

Exemplary electrode materials for the porous electrically conductive layer include Pt, Mo, W, Ni, Cu, Fe, Al, and combinations thereof. The porous electrically conductive layer may also entail more than one layer, such as a Ti adhesion layer and a Pt layer.

The porous electrically conductive layer preferably does not chemically interact with the ionic species conducted by the first ion conductor. For example, the porous electrically conductive layer preferably does not form an intermetallic phase and does not chemically react with the ionic species other than enabling electrochemical oxidation and reduction. Additionally, the porous electrically conductive layer preferably does not chemically interact with the first ion conductor itself, other than possible chemical bonding to adhere to the surface of the first ion conductor. For example, portions of the porous electrically conductive layer preferably do not form mobile ions that are transported to the first ion conductor.

In some embodiments, the first electrode has a high diffusivity for the metal atoms that are sourced. The metal atoms which comprise the atomic vapor have a diffusivity in the first electrode that is preferably at least about $10^{-10}$ cm$^2$/s and more preferably at least about $10^{-6}$ cm$^2$/s, measured at 25° C. or at an operation temperature.

The first electrode is at least a fair electrical conductor. The electrical resistivity of the first electrode is preferably less than 10 kΩ·cm, more preferably less than 1 kΩ·cm, and most preferably less than 1 Ω·cm, measured at 25° C.

In some embodiments, the first electrode comprises an intercalation compound, which is a material capable of being intercalated with atoms of the atomic vapor. In some embodiments, the intercalation compound is graphite, $MoS_2$, $TaS_2$, or a combination thereof, for example. The intercalation compound may be disposed in a uniform layer that consists essentially of the intercalation compound and any intercalated atoms. The thickness of the intercalation compound layer is preferably less than 100 microns and more preferably less than 10 microns.

In some embodiments, the first electrode comprises particles of an intercalation compound in a matrix. The matrix is preferably a polymer binder, such as (but not limited to) poly(vinylpyrrolidone) poly(methacrylate), poly(methyl methacrylate), poly(ethyl methacrylate), poly(2-hydroxyethyl methacrylate), fluoroelastomers, cellulose resin, or a combination thereof. The polymer binder preferably has low outgassing at device operating temperature and is compatible with ultra-high vacuum. Matrix additives may be included to increase the electrical conductivity of the first electrode. For example, small conductive carbon particles may be included (e.g. Super-P® carbon black).

The first electrode may also include a region and/or layer with high electrical conductivity to minimize sheet resistance of the first electrode. For example, the first electrode may consist of two layers: a layer that is substantially graphite and a layer that is a porous electrically conductive layer, such as a thin platinum mesh. This layered configuration may be beneficial to ensure that the electrical potential, when applied, does not vary considerably (e.g., <0.1 V) across the electrode surface even if an intercalation material has mediocre electrical conductivity or if an intercalation material is very thin. The highly electrically conductive layer may include Pt, Mo, W, or a combination thereof. The highly electrically conductive layer may also entail more than one sub-layer, such as a Ti adhesion sub-layer and a Pt sub-layer. The highly electrically conductive layer preferably does not form an intermetallic phase with, or otherwise chemically react with, the ionic species. The highly electrically conductive layer preferably does not chemically interact with the first ion conductor.

In some embodiments, the first electrode is a mixed ion-electron conductor, which means that the first electrode is both an ion conductor and an electron conductor. The mixed ion-electron conductor preferably has an electrical sheet resistance less than 10 MΩ/☐ (10 million ohms per square), more preferably less than 100 kΩ/☐, and most preferably less than 1 kΩ/☐. The electrical resistivity of the mixed ion-electron conductor is preferably less than 100 kΩ·cm, more preferably less than 10 kΩ·cm, and most preferably less than 100 Ω·cm. The ionic conductivity of the mixed ion-electron conductor is preferably at least $10^{-12}$ $\Omega^{-1} \cdot cm^{-1}$, more preferably at least $10^{-9}$ $\Omega^{-1} \cdot cm^{-1}$, and most preferably at least $10^{-6}$ $\Omega^{-1} \cdot cm^{-1}$. The ionic conductance of the mixed ion-electron conductor, through the thickness of the electrode, is preferably less than 10 kΩ, more preferably less than 1 kΩ, and most preferably less than 100Ω.

Exemplary doped mixed ion-electron conductors include, but are not limited to, $Rb_{1-2x}M_xAlO_2$ (x is from 0 to less than 0.5) wherein M=Pb, Cd, and/or Ca; $Rb_{2-2x}Fe_{2-x}M_xO_4$ (x is from 0 to 1) wherein M=P, V, Nb and/or Ta; $Rb_{2-2x}Ga_{2-x}M_xO_4$ (x is from 0 to 1) wherein M=P, V, Nb and/or Ta; $Rb_{2-2x}Al_{2-x}M_xO_4$ wherein M=P, V, Nb and/or Ta; and $Rb_{1-x}Al_{1-x}M_xO_2$ (x is from 0 to less than 1) wherein M=Si, Ti, and/or Ge.

In some embodiments, the mixed ion-electron conductor material may be selected from alkali pyrophosphates, such as $Rb_4P_2O_7$. The alkali pyrophosphate is optionally doped with one or more atoms selected from Ca, Sr, Ba, Pb, Y, La, and/or Nd, for example. Exemplary compounds for the doped alkali pyrophosphates include, but are not limited to, $Rb_{4-2x}M_xP_2O_7$ (x is from 0 to less than 2) wherein M=Ca, Sr, Ba, and/or Pb; and $Rb_{3-3x}M_xPO_4$ (x is from 0 to less than 1) wherein M=Y, La, and/or Nd.

In some embodiments, the mixed ion-electron conductor is a uniform layer that consists essentially of the mixed ion-electron conductor. The thickness of the mixed ion-electron conductor material is preferably about 500 microns or less, and more preferably about 100 microns or less.

In some embodiments employing a mixed ion-electron conductor, the first electrode comprises a region or layer with high electrical conductivity to minimize the electrical sheet resistance of the first electrode. For example, the first electrode may include two layers: a layer that is a mixed ion-electron conductor and a layer that is a highly electrically conductive layer (e.g., a thin Pt mesh). The layered configuration allows for the electrical potential, when applied, to not vary considerably (e.g., <0.1 V) across the electrode surface even if the mixed ion-electron conductor has mediocre electrical conductivity or if the mixed ion-electron conductor is very thin. The highly electrically conductive layer may include Pt, Mo, W, or a combination thereof. The highly electrically conductive layer may itself include sub-layers, such as a Ti adhesion sub-layer and a Pt sub-layer. The highly electrically conductive layer preferably does not chemically interact with the ionic species and preferably does not form an intermetallic phase with the ionic species. Also, the highly electrically conductive layer preferably does not chemically interact with the first ion conductor. For example, when the highly electrically conductive layer contains Pt, preferably $Pt^{2+}$ or other platinum ions do not become mobile ions within the first ion conductor.

The second electrode is preferably in contact with the first ion conductor. The second electrode is not in electrical contact with the first electrode. The second electrode contains at least a second-electrode first phase that stores and transports neutral atoms. Transport of neutral atoms is preferably via diffusion, and storage of neutral atoms is preferably via intercalation.

The atomic species contained within the second-electrode first phase are preferably a reduced form of the same ionic species as in the first ion conductor. Alternatively, or additionally, a different atomic species may be contained within the reservoir. For example, when the device is sourcing atoms, Na may be contained within the second electrode/reservoir and may be oxidized, while Rb may be reduced at the first electrode.

The second-electrode first phase is preferably graphite. The second-electrode first phase may include predominately $sp^2$-bonded carbon. Examples of $sp^2$-bonded carbon include, but are not limited to, graphite, monolayer graphene, few-layer graphene, graphene flakes, holey graphene (perforated graphene), carbon nanotubes, fullerenes (e.g., $C_{60}$, $C_{70}$, etc.), polyaromatic hydrocarbons (e.g., pentacene, rubrene, hexabenzocoronene, coronene, etc.), chemical-vapor-deposited graphitic carbon, pyrolyzed carbon-containing molecules or polymers include pyrolyzed parylenes (e.g., pyrolyzed poly(para-xylylene) or analogues thereof), or combinations of the foregoing.

The second-electrode first phase may alternatively, or additionally, include a metal dichalcogenide. In various embodiments, the second-electrode first phase includes a transition metal oxide (e.g., ZnO), a transition metal sulfide (e.g., $MoS_2$ or $TaS_2$), a transition metal selenide (e.g., $TiSe_2$), or a transition metal telluride (e.g., $TiTe_2$).

The second-electrode first phase is preferably in the form of particles. It is preferable that the particles have at least one dimension that is relatively short to reduce the diffusion length for neutral atoms, thereby improving the transport rate. The particles of the second-electrode first phase may have a minimum dimension (e.g., diameter of spheres or rods) of less than 1000 microns, less than 500 microns, less than 100 microns, less than 50 microns, less than 10 microns, less than 5 microns, less than 1 micron, or less than 500 nanometers, for example. In preferred embodiments, the particles of the second-electrode first phase have a minimum dimension selected from about 100 nanometers to about 20 microns. Particle sizes may be measured by a variety of techniques, including dynamic light scattering, laser diffraction, image analysis, or sieve separation, for example.

The second-electrode first phase is preferably a continuous phase or a semi-continuous phase. For example, the second-electrode first phase may be or include a carbon aerogel, a carbonized polymer, or reticulated vitreous carbon foam.

The second electrode is preferably electrically conductive. In various embodiments, the electrical resistivity of the second electrode is preferably less than 10 kΩ·cm, more preferably less than 1 kΩ·cm, even more preferably less than 100 Ω·cm, and most preferably less than 10 Ω·cm, measured at 25° C.

The thickness of the second electrode may be selected from about 1 micron (or less) to about 100 microns (or more). Typically, the second electrode is thicker than the first electrode or the third electrode.

In addition to the first phase, the second electrode may contain one or more other phases to form a composite electrode/reservoir. For example, see U.S. Pat. No. 10,545,461 to Roper et al, which has been incorporated by reference herein. An additional phase may be an atom-transporting phase that stores and transports neutral atoms. Transport of neutral atoms is preferably via diffusion. At a fixed point in time, neutral atoms may be in the process of being transported into or out of the atom-transporting phase, may be stored at a fixed location within the atom-transporting phase, or may be moving within the atom-transporting phase but not across its phase boundary, and therefore stored within that phase. Transport of neutral atoms within the atom-transporting phase and/or across its phase boundaries may occur via various diffusion mechanisms, such as (but not limited to) bulk solid diffusion, porous diffusion, surface diffusion, grain boundary diffusion, permeation, solubility-diffusion, etc. Storage of neutral atoms is preferably via intercalation. Storage of neutral atoms also results when the diffusion rate of metal atoms is negligible (e.g., less than $10^{-10}$ $cm^2/s$).

In the atom-transporting phase of the second electrode, the selected metal atoms may have a diffusion coefficient of at least about $10^{-10}$ $cm^2/s$, $10^{-9}$ $cm^2/s$, $10^{-8}$ $cm^2/s$, $10^{-7}$ $cm^2/s$, $10^{-6}$ $cm^2/s$, or $10^{-5}$ $cm^2/s$, measured at the device-operation temperature, such as 25° C., 100° C., 150° C., or 200° C. The metal-atom diffusion in the second electrode as a whole will depend on the bulk diffusivity of the atom-transporting phase, the volume fraction of the atom-transporting phase, and the connectivity/tortuosity of atom-transporting phase.

The atomic species contained in the atom-transporting phase is preferably the reduced (neutral charge) form of at least one of the ionic species contained in the first ion conductor. Alternatively, or additionally, the atom-transporting phase may contain an atomic species that is different than the species contained in the first ion conductor. For example, when the device is configured to source atoms, Na may be contained within the atom-transporting phase, Na may be oxidized to $Na^+$ at the second electrode, $Rb^+$ may be reduced to Rb at the first electrode, and the first ion conductor may contain both $Na^+$ and $Rb^+$.

The atom-transporting phase and/or the second-electrode first phase preferably contain an intercalable compound that is capable of being intercalated by at least one element in ionic and/or neutral form. As used herein, an "intercalable compound" (or "intercalatable compound") is a host material that is capable of forming an intercalation compound with guest atoms which comprise the atomic vapor whose density is being controlled. Stated another way, the intercalable compound is intercalative for (capable of intercalating) at least some of the atoms in the atomic vapor. The guest atoms that are intercalated may be neutral atoms, ionic species, or a combination thereof. Typically, the guest atoms are intercalated as neutral atoms.

In some embodiments, the host material actually contains the guest species, resulting in a material which may be referred to as an "intercalation compound." It is noted that for the purposes of this patent application, any reference to intercalable compound may be replaced by intercalation compound, and vice-versa, since an intercalable compound must be capable of intercalating a guest species but may or may not actually contain the intercalated guest species.

"Intercalation" herein is not limited to the reversible inclusion or insertion of an atom, ion, or molecule sandwiched between layers present in a compound, which shall be referred to herein as "layer intercalation." Intercalation also includes absorption of neutral atoms or ionic species into a bulk phase of the compound, whether that phase is amorphous or crystalline; adsorption of neutral atoms or ionic species onto an outer surface or an internal surface (e.g., a phase boundary) present in the compound; and reversible chemical bonding between the neutral atoms or ionic species, and the compound.

Some embodiments of the invention utilize layer intercalation, in which a guest species such as K expands the van der Waals gap between sheets of a layered compound such as graphite. This layer expansion requires energy. Without being limited by theory, the energy may be supplied by electrical current to initiate charge transfer between the guest (e.g., K) and the host solid (e.g., graphite). In this example, potassium graphite compounds such as $KC_8$ and $KC_{24}$ may be formed. These compounds are reversible, so that when the electrical current is adjusted, the potassium graphite compounds may give up the intercalated atoms (K). Those previously intercalated atoms may be released into the vapor phase or into the first ion conductor, for example. Electrical energy may be supplied to cause a chemical potential change at the interface with the intercalable compound, which then causes layer expansion.

In some embodiments, the intercalable compound is a carbonaceous material, such as a material selected from the group consisting of graphite, graphite oxide, graphene, graphene oxide, holey graphene, graphene platelets, carbon nanotubes, fullerenes, activated carbon, coke, pitch coke, petroleum coke, carbon black, amorphous carbon, glassy carbon, pyrolyzed carbon-containing molecules, pyrolyzed parylene, polyaromatic hydrocarbons, and combinations thereof.

The intercalable carbonaceous material may be at least 50 wt % carbon, preferably at least 75 wt % carbon, more preferably at least 90 wt % carbon, most preferably at least 95 wt % carbon. In some embodiments, the carbonaceous material is essentially pure carbon, except for impurities. The carbonaceous material may include mesoporous carbon, microporous carbon, nanoporous carbon, or a combination thereof.

The intercalable carbonaceous material may be a form of predominately $sp^2$ bonded carbon. Examples of $sp^2$ bonded carbon include, but are not limited to, graphite, graphene, carbon nanotubes, carbon fibers, fullerenes (e.g. $C_{60}$ or $C_{70}$), pyrolyzed carbon-containing molecules or polymers (such as pyrolyzed parylene, e.g. parylene-N, parylene-C, or parylene-AF-4), and large polyaromatic hydrocarbons (e.g. pentacene, rubrene, hexabenzocoronene, or coronene). In the case of graphene (which is essentially a single layer of graphite), the graphene may be monolayer graphene or multiple layers of graphene. Graphene flakes (a few layers of graphene) may be utilized. Certain embodiments utilize monolayer holey graphene, multiple layers of holey graphene, or graphene platelets.

In certain embodiments, the carbonaceous material comprises graphite. Graphite consists of planes of carbon sheets. Metal atoms, especially alkali atoms, readily intercalate between these carbon sheets, leading to a high diffusivity for those atoms. Graphite electrodes enable fast metal transport at low voltages and low power consumption per atom removed. Graphite not only transports atoms via intercalation, but also is electrically conductive due to the electron delocalization within the carbon layers. Valence electrons in the carbon are free to move, thereby conducting electricity through the graphite.

The graphite may be natural graphite (e.g., mined graphite) or synthetic graphite produced from various techniques. For example, graphite may be obtained from chemical-vapor-deposited graphitic carbon, carbide-derived graphite, recycled graphite, waste from graphene manufacture, and so on. Crystalline flake graphite occurs as isolated, flat, plate-like particles with hexagonal edges if unbroken; when broken the edges can be irregular or angular. Amorphous graphite is very fine flake graphite. Lump graphite occurs in fissure veins or fractures and appears as massive platy intergrowths of fibrous or acicular crystalline aggregates. Highly oriented pyrolytic graphite is graphite with an angular spread between the graphite sheets of less than 1°.

The graphite may be crystalline, amorphous, or a combination thereof. The graphite crystallinity may range from about 10% to about 90%, for example. A mixture of crystalline and amorphous graphite may be beneficial for intercalation not only between crystal layers but also between crystalline and amorphous regions of the graphite. With too much crystallinity, the diffusivity becomes highly anisotropic. If highly crystalline (i.e. highly anisotropic) graphite is oriented with the low-diffusivity axis normal to the surface of the device (which is a typical orientation), reduced alkali flux, and thus reduced performance, would result.

In some embodiments, the intercalable compound of the atom-transporting phase is a transition-metal oxide, a transition-metal dichalcogenide, or a combination thereof. The intercalable compound may also be a mixture of a carbonaceous material and a transition-metal oxide, or a mixture of a carbonaceous material and a transition-metal dichalcogenide, or a mixture of all of these materials. Specifically, the intercalable compound may be a metal dichalcogenide selected from $MoS_2$, $TaS_2$, $TiTe_2$, or any other transition metal dioxide, disulfide, diselenide, or ditelluride.

The second electrode is preferably encapsulated by the first ion conductor and one or more reservoir walls. The encapsulation may be a single encapsulate (e.g., UHV epoxy) or a bonded substrate employing UHV epoxy or thermocompression-bonded silicon, borosilicate glass, or alumina die, for example.

The first ion conductor preferably has high ionic conductivity for a selected ionic species. The ionic conductivity is preferably at least $10^{-7}$ S/cm, and more preferably at least $10^{-5}$ S/cm, measured at 25° C. or at a device operating temperature. The ionic species may be an ionized form of an atom of interest in atomic physics and atomic measurement instruments. In various embodiments, the ionic species is selected from the group consisting of $Li^+$, $Na^+$, $K^+$, $Rb^+$, $Cs^+$, $Sr^+$, $Sr^{2+}$, $Ca^+$, $Ca^{2+}$, $Ba^+$, $Yb^{2+}$, $Yb^{3+}$, $Hg^+$, $Hg^{2+}$, and combinations thereof (i.e., multiple ions may be present in the device).

The first ion conductor preferably includes a solid electrolyte. For example, the first ion conductor may be a large fraction (>50% by weight) β-alumina, β"-alumina, or a combination of β-alumina and β"-alumina. β-alumina and β"-alumina are good conductors of their mobile ions yet allow negligible non-ionic (i.e., electronic) conductivity. β"-alumina is a hard polycrystalline or monocrystalline ceramic material. β-alumina and/or β"-alumina are also referred to herein as "beta-alumina." When prepared as a solid electrolyte, beta-alumina is complexed with a mobile ion, such as $Na^+$, $K^+$, $Li^+$, $Rb^+$, $Cs^+$, $Sr^{2+}$, or $Ca^{2+}$, in which case the material becomes sodium-beta-alumina, potassium-beta-alumina, lithium-beta-alumina, rubidium-beta-alumina, cesium-beta-alumina, strontium-beta-alumina, or calcium-beta-alumina, respectively.

Other possible solid electrolyte materials for the first ion conductor include yttria-stabilized zirconia, NASICON, LISICON, KSICON, alkali-ion-exchanged versions thereof, and combinations of any of the foregoing. In these or other embodiments, chalcogenide glasses may be used as solid electrolyte materials for the first ion conductor. Exemplary chalcogenide glasses include, but are not limited to, RbI—$GeSe_2$—$Ga_2Ge_3$ and CsI—$GeSe_2$—$Ga_2Ge_3$.

The atomic-beam source device may include an atom reservoir that is distinct from the second electrode/reservoir. This additional atom reservoir is preferably in contact with the second electrode. The atom reservoir may be comprised, in part or in whole, by graphite or graphitic carbon. The graphite or graphitic carbon provides electrical conductivity and also a means of storing atoms, such as in a graphite intercalation compound.

The atom reservoir may contain metal in the vapor phase and possibly in solid and/or liquid phases as well. The atomic species contained within the atom reservoir is preferably the reduced form of the same ionic species as in the first ion conductor. Alternatively, a different atomic species may be contained within the atom reservoir.

The atom reservoir and/or the second electrode may be designed to accommodate any mechanical strain from a changing reservoir volume due to the loss or introduction of atoms. For instance, a gap may be situated between an intercalation compound and the reservoir walls to permit expansion of the intercalation compound without straining the reservoir walls. The reservoir walls may be designed to elastically and/or plastically deform. This configuration may be accomplished through material selection (e.g. metals, polymers, or a combination thereof). Alternatively, or additionally, this configuration may be accomplished through reservoir design (e.g. a bellows).

The atom reservoir and/or the second electrode has walls that are preferably impermeable to the atomic species contained inside the reservoir. The walls are preferably thin films and supported by a substrate (e.g. glass, Si, alumina, etc.). The side(s) of the reservoir walls that face the interior of the reservoir preferably do not chemically interact with the ionic species. For example, the reservoir walls do not form an intermetallic phase with the ionic species and do not chemically react with the ionic species. Exemplary reservoir wall materials include Pt, Mo, W, or a combination thereof, for the walls that face the interior of the reservoir. When there are side(s) of the reservoir walls that touch the first ion conductor, the reservoir walls preferably do not chemically interact with the first ion conductor, other than chemical bonding to adhere to the first ion conductor. Exemplary reservoir wall materials include Pt, Mo, W, or a combination thereof, for the walls (if any) that touch the first ion conductor.

Multiple ion conductors, each with their own electrodes, may be present in a single device. Multiple first electrodes may or may not be electrically connected through electrical leads or electrical traces. Likewise, multiple second electrodes may or may not be electrically connected through electrical leads or electrical traces.

Multiple sets of first electrodes, ion conductors, and second electrodes may generally be present. In some embodiments, two or more first (front) electrodes are employed. In these or other embodiments, two or more second (back) electrodes are employed. In any of these embodiments, or other embodiments, two or more ion conductors are employed.

Each electrode is typically connected to an electrical lead fabricated from an electrically conductive material. A lead is an electrical connection consisting of a length of wire, metal pad, metal trace, or other electrically conductive structure. Leads are used to transfer power and may also provide physical support and potentially provide a heat sink. In some embodiments, a device is provided without such leads, which may be added at a later time, before use.

There are many options for the electrical connections to the first and second electrodes of the atomic-beam source device. The electrical connections may be connected to bond pads for connection to an external circuit. The electrical connections may include through-wafer vias, patterned electrically conductive thin films, doped regions of semiconductors, wire bonds, or a combination thereof. Patterned thin films may be parallel with the first electrode, such as when the first electrode is substantially flat. Parts of patterned thin films may be at an angle with the first electrode. In some embodiments, the electrode connections travel out of the plane of the electrode to which it is connected.

The atomic-beam source device may be contained within an oven. The purpose of the oven may be to control the temperature of the device at a temperature above the ambient temperature, for example. In principle, the atomic-beam source device may be contained within any sort of temperature-controlled system, for heating or cooling the device.

The atomic-beam source device may be operated at a wide range of temperatures and pressures. In various embodiments, the atomic-beam source device may be operated at a temperature from about −200° C. to about 500° C., preferably from about −50° C. to about 250° C., and more preferably from about 10° C. to about 200° C. After atoms are emitted from the atomic-beam source device, those atoms may be cooled to ultra-low temperatures (e.g., $10^{-7}$ K to $10^{-3}$ K) as needed for some applications or measurements. In various embodiments, the atomic-beam source device may be operated at a pressure from about 7600 torr (10 atm) to about $10^{-14}$ torr, preferably from about $10^{-3}$ to about $10^{-13}$ torr, and more preferably from about $10^{-7}$ torr to about $10^{-12}$ torr.

The atomic-beam source device may include an integrated heater. The integrated heater may be a resistive heater, such as a thin wire or a patterned thin metal trace (e.g. Pt or nickel-chromium alloy). The integrated heater may also be a radiative heater or a thermoelectric heater, for example. The integrated heater preferably includes a temperature sensor, such as a thermocouple or a resistance temperature detector (e.g., Pt). Preferably, the heater is in good thermal communication with the region of the first ion conductor that is near the first electrode.

In some embodiments, the atomic-beam source device is a chip-scale device that is mounted or integrated on a microelectromechanical systems (MEMS) heater stage to minimize heater power.

When an integrated heater is included in the device, the heater may further comprise one or more thermal isolation structures. A thermal isolation structure minimizes heat transfer from the heated region of the device to the colder, ambient environment. A thermal isolation structure is configured to minimize heat loss out of the heated region into a cold region, by functioning as insulation to retain heat within the heated region. The thermal isolation structure preferably has a high value of thermal resistance, as further explained below.

A thermal isolation structure may be made of the same material and layer as the atom reservoir walls, in some embodiments. In these or other embodiments, a thermal isolation structure may be made of the same material and layer as the first ion conductor. The thermal isolation structure is preferably polymer, ceramic, or glass, although metal may be utilized as well, or a combination of the foregoing.

In some embodiments, the thermal isolation structure is fabricated from a material selected from the group consisting of β-alumina (e.g., Rb-β-alumina, Na-β-alumina, or Sr-β-alumina), β''-alumina (e.g., Rb-β''-alumina, Na-β''-alumina, or Sr-β''-alumina), α-alumina, silica, fused silica, quartz, borosilicate glass, silicon, silicon nitride, silicon carbide, and combinations thereof.

The thermal isolation structure may be designed to accommodate materials with any thermal conductivity. High-thermal-conductivity materials will benefit from long, high-aspect ratio connections, while lower-thermal-conductivity materials may utilize shorter, stubbier connections.

An important design parameter for the thermal isolation structure (when present) is the thermal resistance. The thermal resistance is the temperature difference across the thermal isolation structure when a unit of heat energy flows through it in unit time; or equivalently, the temperature difference, at steady state, between two defined surfaces of the thermal isolation structure that induces a unit heat flow rate. Because the desire is for a low heat flow rate, a high temperature difference is desired, i.e., a high value of thermal resistance. The thermal resistance of a thermal isolation structure is preferably at least 100 K/W, more preferably at least 1,000 K/W, and most preferably at least 10,000 K/W.

A thermal isolation structure may also be configured to impart mechanical strain relief, thereby preventing mechanical damage due to thermal strains that build up when the first ion conductor is heated to a higher temperature than the base substrate. In some embodiments, a thermal isolation structure is mechanically connected to a base substrate, for example through a frame. Preferably, the thermal isolation structure is designed to reduce thermal stress or residual stress by at least 2×, preferably at least 10×, and more preferably at least 100× from one side of the thermal isolation structure to the other side. The thermal or residual stress reduction is not an inherent material property, but is a function of the geometric design of the thermal isolation structure and its material properties.

In some embodiments, a thermal isolation structure is a suspension beam. Typically, a plurality of suspension beams will be present to connect the heated region to the cold region. The heated region only contacts the cold region through the suspension beams. The suspension beams may be straight beams, folded beams, tortuous beams, circular beams, and so on. The suspension beams may be made in any one (or more) layers in a planar process, such as surface or bulk micromachining. The rest of the heated region may be surrounded by vacuum or a vapor phase (e.g., containing an inert gas), either of which has a high thermal resistance to the cold region. As an alternative, the vapor/vacuum region may include a thermal insulator material, such as an aerogel.

In some embodiments, a thermal isolation structure has a thin metal film patterned on it for electrical interconnections. In some preferred embodiments, a resistive heater and a temperature sensor are patterned on (in contact with) the same layer as at least one thermal isolation structure. Preferably, electrical connections to the heater and the temperature sensor are also patterned on one or more thermal isolation structures. Optionally, part or all of the heater may be patterned on a thermal isolation structure or on multiple thermal isolation structures. In some embodiments, a thin film resistive heater is patterned on one or more sides of the same layer as a thermal isolation structure. In cases where the first ion conductor is separate from the thermal isolation structure, the heater may be patterned on the same side or the opposite side of the thermal isolation structure compared to the position of the first ion conductor. In cases where the first ion conductor is the same as a thermal isolation structure, or a layer thereof, the heater may be patterned on either side of the first ion conductor (i.e. on the first-electrode side and/or on the second-electrode side). See commonly owned U.S. patent application Ser. No. 16/573,684, filed on Sep. 17, 2019, which is hereby incorporated by reference herein.

The integration of the heater and thermal isolation structures within the system enables low system power input. The system power input for controlling vapor density of metal atoms is preferably less than about 500 mW, more preferably less than about 200 mW, and most preferably less than about 100 mW. In various embodiments, the system power input for sourcing and/or sinking metal atoms is about 1000, 500, 400, 300, 200, 100, 50, 25, or 10 mW.

In some embodiments in which high vapor density is desirable, the density of metal atoms may be at least $10^9$ atoms per $cm^3$, preferably at least $10^{10}$ per $cm^3$, and more preferably at least $10^{11}$ per $cm^3$. In some embodiments in which low vapor density is desirable, the density of metal atoms may be below $10^8$ atoms per $cm^3$, preferably below $10^7$ atoms per $cm^3$. In various embodiments, the density of metal atoms if about, at least about, or at most about $10^6$ atoms per $cm^3$, $10^7$ atoms per $cm^3$, $10^8$ atoms per $cm^3$, $10^9$ atoms per $cm^3$, $10^{10}$ atoms per $cm^3$, $10^{11}$ atoms per $cm^3$, or $10^{12}$ atoms per $cm^3$.

The atomic-beam source device may be fabricated on a wide variety of length scales. The length scale may be characterized by the square root of the first electrode area. This length scale may vary from 10 m to 1 micron, with 1 m to 10 mm being typical for macroscale atomic timing and navigation systems, and 30 mm to 10 microns being typical for chip-scale atomic timing and navigation systems.

Chip-scale devices are preferably constructed using microfabrication techniques, including some or all of lithography, evaporation, shadow-masking, evaporation, sputtering, wafer bonding, die bonding, anodic bonding, glass frit bonding, metal-metal bonding, and etching.

This disclosure hereby incorporates by reference herein the following patents for teaching solid-state electrochemical atom sources that are used in some embodiments, as atom sources and/or atom sinks: U.S. Pat. No. 9,763,314, issued Sep. 12, 2017; U.S. Pat. No. 9,837,177, issued Dec. 5, 2017; U.S. Pat. No. 10,056,913, issued Aug. 21, 2018; U.S. Pat. No. 10,545,461, issued Jan. 28, 2020; U.S. Pat. No. 10,775,748, issued Sep. 15, 2020; U.S. Pat. No. 10,828,618, issued Nov. 10, 2020; and U.S. Pat. No. 11,101,809, issued Aug. 24, 2021. All publications, patents, and patent applications cited in this specification are herein incorporated by reference in their entirety as if each publication, patent, or patent application were specifically and individually put forth herein.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. An interferometric frequency-reference apparatus, said apparatus comprising:
    a vacuum chamber;
    an atom source configured to supply neutral atoms to be ionized;
    an ionizer configured to excite said neutral atoms to form ionized atoms;
    an ion collimator configured to form a collimated beam of said ionized atoms;
    one or more probe lasers; and
    a readout laser configured to determine a ground-state population of said ionized atoms,
    wherein said atom source, said ionizer, and said ion collimator are disposed within said vacuum chamber.

2. The interferometric frequency-reference apparatus of claim 1, wherein said atom source is a solid-state electrochemical atom source.

3. The interferometric frequency-reference apparatus of claim 1, wherein said ionizer is disposed inside said ion collimator.

4. The interferometric frequency-reference apparatus of claim 1, wherein said ionizer is disposed outside said ion collimator.

5. The interferometric frequency-reference apparatus of claim 1, wherein said ion collimator is a linear collimator.

6. The interferometric frequency-reference apparatus of claim 5, wherein said linear collimator is selected from the group consisting of a linear quadrupole trap, a Penning trap, a surface ion trap, and a mass filter.

7. The interferometric frequency-reference apparatus of claim 1, wherein said ion collimator is a non-linear collimator.

8. The interferometric frequency-reference apparatus of claim 7, wherein said non-linear collimator is in a recirculating configuration.

9. The interferometric frequency-reference apparatus of claim 1, wherein said ion collimator is configured such that said collimated beam of said ionized atoms has a beam waist selected from about 10 nanometers to about 10 meters.

10. The interferometric frequency-reference apparatus of claim 1, wherein said ion collimator is configured such that said collimated beam of said ionized atoms has a beam velocity selected from about 1 micron/second to about 0.99c, where c is the speed of light in vacuum.

11. The interferometric frequency-reference apparatus of claim 1, wherein said one or more probe lasers are configured for Ramsey spectroscopy on said ionized atoms.

12. The interferometric frequency-reference apparatus of claim 1, wherein said one or more probe lasers is two or more probe lasers.

13. The interferometric frequency-reference apparatus of claim 1, wherein said one or more probe lasers are configured to probe quadrupole or both dipole and quadrupole transitions of said ionized atoms.

14. The interferometric frequency-reference apparatus of claim 1, wherein said interferometric frequency-reference apparatus further comprises a cooling laser.

15. The interferometric frequency-reference apparatus of claim 1, wherein said readout laser is further configured for cooling.

16. The interferometric frequency-reference apparatus of claim 1, wherein said interferometric frequency-reference apparatus further comprises an injection electrode.

17. The interferometric frequency-reference apparatus of claim 1, wherein said interferometric frequency-reference apparatus further comprises an ion sink configured to collect said ionized atoms exiting said ion collimator, and wherein said ion sink is disposed within said vacuum chamber.

18. The interferometric frequency-reference apparatus of claim 1, wherein said interferometric frequency-reference apparatus further comprises an imaging system configured to focus fluorescence from said ionized atoms.

19. The interferometric frequency-reference apparatus of claim 1, wherein said interferometric frequency-reference apparatus provides an optical frequency reference.

20. The interferometric frequency-reference apparatus of claim 1, wherein said interferometric frequency-reference apparatus provides a microwave frequency reference.

21. A method of creating a stable frequency reference, said method comprising:
    (a) creating an atomic vapor;
    (b) ionizing at least some atoms in said atomic vapor, to form ionized atoms;
    (c) collimating said ionized atoms in an ion collimator, to form a collimated beam of said ionized atoms;
    (d) optionally, illuminating some of said ionized atoms with a cooling laser;
    (e) illuminating at least some of said ionized atoms with a first probe laser at a first-probe-laser frequency;
    (f) illuminating at least some of said ionized atoms with a second probe laser at a second-probe-laser frequency;
    (g) adjusting said first-probe-laser frequency and said second-probe-laser frequency using Ramsey spectroscopy to an S→D transition of at least some of said ionized atoms; and
    (h) illuminating at least some of said ionized atoms with a readout laser to determine a ground-state population of said ionized atoms.

22. The method of claim 21, wherein said atomic vapor and/or said ionized atoms are obtained from a solid-state electrochemical atom source.

23. The method of claim 21, wherein said ionized atoms are $Ca^+$ and/or $Sr^+$.

24. The method of claim 21, wherein said ionized atoms provided in step (b) are formed within said ion collimator provided in step (c).

25. The method of claim 21, wherein said ionized atoms provided in step (b) are injected into said ion collimator.

26. The method of claim 21, wherein step (d) is conducted to cool said ionized atoms in preparation for said Ramsey spectroscopy.

27. The method of claim 21, wherein said ion collimator is a linear collimator.

28. The method of claim 27, wherein said linear collimator is selected from the group consisting of a linear quadrupole trap, a Penning trap, a surface ion trap, and a mass filter.

29. The method of claim 21, wherein said ion collimator is a non-linear collimator.

30. The method of claim 29, wherein said non-linear collimator is in a recirculating configuration.

31. The method of claim 21, wherein said collimated beam of said ionized atoms has a beam waist selected from about 10 nanometers to about 10 meters.

32. The method of claim 21, wherein said collimated beam of said ionized atoms has a beam velocity selected from about 1 micron/second to about 0.99c, where c is the speed of light in vacuum.

33. The method of claim 21, wherein said method further comprises illuminating at least some of said ionized atoms with a third probe laser.

34. The method of claim 33, wherein said method further comprises illuminating at least some of said ionized atoms with a fourth probe laser after said illuminating at least some of said ionized atoms with said third probe laser.

35. The method of claim 21, wherein said method is continuous.

36. The method of claim 21, wherein said stable frequency reference is an optical frequency reference.

37. The method of claim 21, wherein said stable frequency reference is a microwave frequency reference.

38. The method of claim 21, wherein said method utilizes the interferometric frequency-reference apparatus according to claim 1.

* * * * *